United States Patent
Wang et al.

(10) Patent No.: US 12,354,959 B2
(45) Date of Patent: Jul. 8, 2025

(54) REDISTRIBUTION LAYER FEATURES

(71) Applicant: Taiwan Semiconductor Manufacturing Company, Ltd., Hsinchu (TW)

(72) Inventors: Wen-Chun Wang, Taichung (TW); Tzy-Kuang Lee, Taichung (TW); Chih-Hsien Lin, Tainan (TW); Ching-Hung Kao, Tainan (TW); Yen-Yu Chen, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 211 days.

(21) Appl. No.: 18/328,916

(22) Filed: Jun. 5, 2023

(65) Prior Publication Data

US 2023/0307366 A1    Sep. 28, 2023

Related U.S. Application Data

(62) Division of application No. 17/308,321, filed on May 5, 2021, now Pat. No. 11,670,594.

(Continued)

(51) Int. Cl.
*H01L 23/532* (2006.01)
*H01L 21/56* (2006.01)
(Continued)

(52) U.S. Cl.
CPC ........ *H01L 23/53238* (2013.01); *H01L 21/56* (2013.01); *H01L 21/76831* (2013.01);
(Continued)

(58) Field of Classification Search
CPC ............. H01L 23/5223; H01L 23/5226; H01L 23/5283; H01L 23/5389; H01L 23/53238;
(Continued)

(56) References Cited

U.S. PATENT DOCUMENTS 11,145,564 B2   10/2021  Huang
2006/0291029 A1  12/2006  Lin
(Continued)

OTHER PUBLICATIONS

Hsiang-Ku Shen et al., "Multilayer Capacitor Electrode", U.S. Appl. No. 16/888,429, filed May 29, 2020, Assignee: Taiwan Semiconductor Manufacturing Co., Ltd., 27 pages specification, 13 pages drawings.

(Continued)

*Primary Examiner* — Zandra V Smith
*Assistant Examiner* — John M Parker
(74) *Attorney, Agent, or Firm* — HAYNES AND BOONE, LLP

(57) ABSTRACT

Semiconductor structures and method of forming the same are provided. A semiconductor structure according to the present disclosure includes a contact feature in a dielectric layer, a passivation structure over the dielectric layer, a conductive feature over the passivation structure, a seed layer disposed between the conductive feature and the passivation structure, a protecting layer disposed along sidewalls of the conductive feature, and a passivation layer over the conductive feature and the protecting layer.

20 Claims, 24 Drawing Sheets

Related U.S. Application Data

(60) Provisional application No. 63/137,447, filed on Jan. 14, 2021.

(51) Int. Cl.
*H01L 21/768* (2006.01)
*H01L 23/29* (2006.01)
*H01L 23/31* (2006.01)
*H01L 23/522* (2006.01)
*H01L 23/528* (2006.01)

(52) U.S. Cl.
CPC .. *H01L 21/76832* (2013.01); *H01L 21/76871* (2013.01); *H01L 23/291* (2013.01); *H01L 23/3171* (2013.01); *H01L 23/5223* (2013.01); *H01L 23/5226* (2013.01); *H01L 23/5283* (2013.01)

(58) Field of Classification Search
CPC ............. H01L 23/291; H01L 21/76804; H01L 21/76843; H01L 21/76877; H01L 21/76805
See application file for complete search history.

(56) References Cited

U.S. PATENT DOCUMENTS

| | | |
|---|---|---|
| 2010/0224960 A1 | 9/2010 | Fischer |
| 2013/0270675 A1 | 10/2013 | Childs |
| 2016/0181196 A1* | 6/2016 | Lee ................... H01L 23/53238 257/773 |
| 2019/0035728 A1* | 1/2019 | Venegoni ............ H01L 23/5283 |
| 2020/0006128 A1 | 1/2020 | Weng |
| 2020/0035596 A1 | 1/2020 | Kao |
| 2020/0118953 A1 | 4/2020 | Yu |

OTHER PUBLICATIONS

Yuan-Yang Hsiao et al., "Metal-Insulator-Metal Structure", U.S. Appl. No. 16/802,246, filed Feb. 26, 2020, Assignee: Taiwan Semiconductor Manufacturing Co., Ltd., 28 pages specification, 21 pages drawings.

Hsiang-Ku Shen et al., "Process for Forming Metal-Insulator-Metal Structures", U.S. Appl. No. 16/787,933, filed Feb. 11, 2020, Assignee: Taiwan Semiconductor Manufacturing Co., Ltd., 26 pages specification, 22 pages drawings.

* cited by examiner

REDISTRIBUTION LAYER FEATURES

PRIORITY DATA

The present application is a divisional application of U.S. application Ser. No. 17/308,321, filed May 5, 2021, which claims the benefit of U.S. Provisional Application No. 63/137,447, entitled "Redistribution Layer Features," filed Jan. 14, 2021, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, conductive features in a redistribution layer may be formed by depositing a seed layer and then forming a conductive feature over the seed layer. The conductive feature is formed of a metal that is more conductive than the seed layer. The seed layer below the conductive features is etched back to electrically isolate the conductive features. Unsatisfactory etching selectivity between the seed layer and the conductive features may lead to damages to or loss of the conductive features, resulting in increased resistance. Therefore, while existing redistribution layers are adequate for its intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
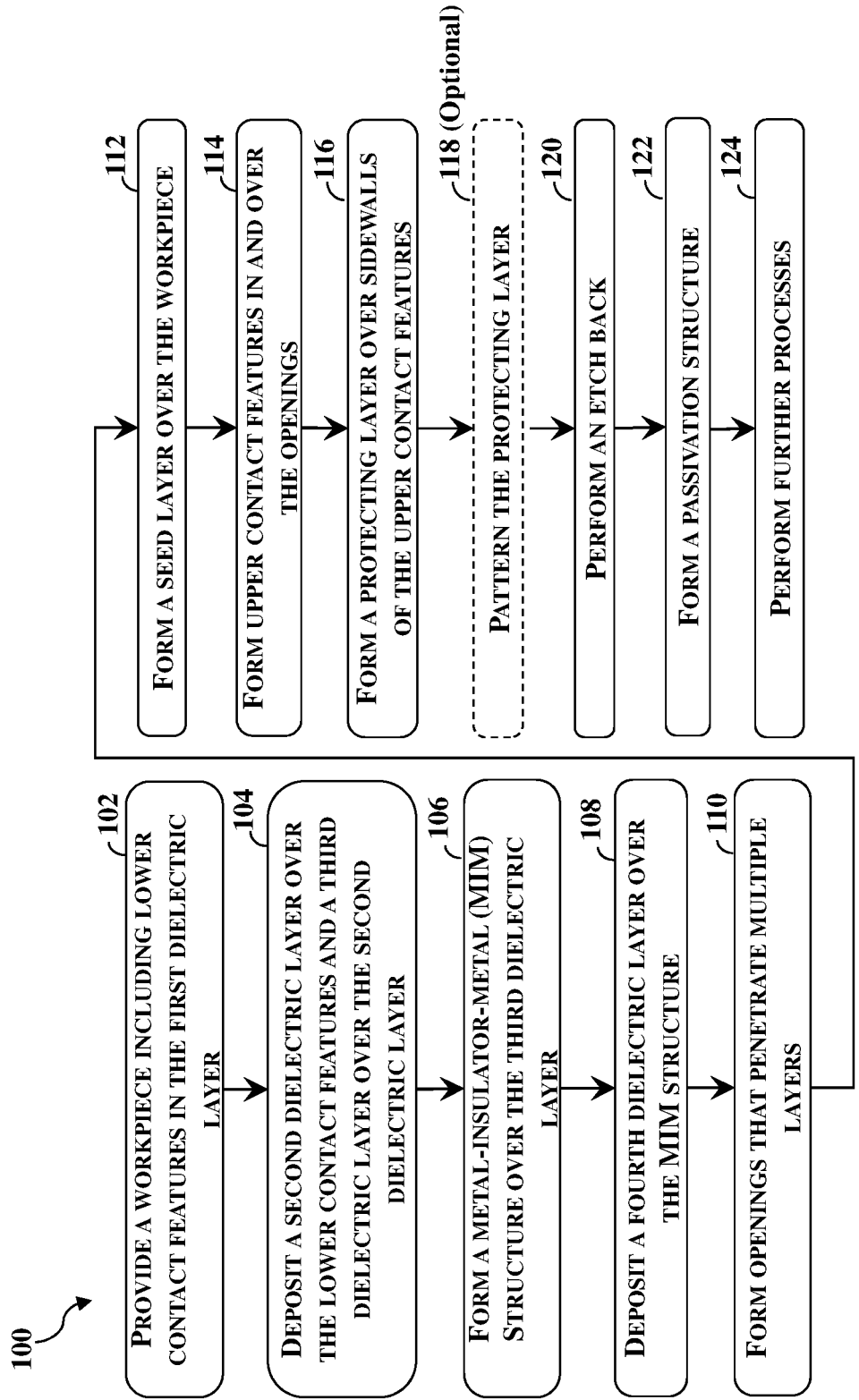
FIG. 1 is a flow chart of a method for fabricating a semiconductor structure in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In integrated circuit (IC) fabrication, a redistribution layer (RDL) refers to an additional metal layer over a die to move input/output (I/O) pads of devices in the die to different locations for improved access or connection to the I/O pads. In some example processes, to form a conductive feature in an RDL, a seed layer is first blanketly deposited over a workpiece and then the conductive feature is formed over the seed layer. To electrically isolate the conductive features, an etch back process is performed to remove portions of the seed layer not covered by the conductive features. Due to etching selectivity limitations, the etch back of the seed layer may damage the conductive features, resulting in loss of volume of the conductive features and increased resistance.

The present disclosure provides processes or a protecting structure to protect RDL conductive features for reduced resistance. The protective structure may be a single layer or a multi-layer. When the protective structure is a single layer, it may be formed of silicon nitride. When the protective structure is multi-layer, it may include a dual-layer structure or a tri-layer structure. An example dual-layer structure may include an oxide layer and nitride layer. An example tri-layer structure may include an inner nitride layer, a middle oxide layer, and an outer nitride layer. The protecting structure of the present disclosure is formed before the etch back of the seed layer and protects the RDL conductive features during the etch back process. It is observed that the protecting structure of the present disclosure prevents the RDL conductive features from being damaged during the etch back process.

The various aspects of the present disclosure will now be described in more detail with reference to the figures. In that regard, FIG. 1 is a flowchart illustrating a method 100 for fabricating a semiconductor device according to embodiments of the present disclosure. The method 100 is merely an example and is not intended to limit the present disclosure to what is explicitly illustrated in the method 100. Additional steps can be provided before, during, and after the method 100, and some steps described can be replaced, eliminated, or moved around for additional embodiments of the method. Not all steps are described herein in detail for reasons of simplicity. The method 100 is described below in conjunction with FIGS. 2-24, which are fragmentary cross-sectional views of a workpiece 200 at different stages of fabrication of method 100 in FIG. 1. Because the workpiece 200 will be fabricated into a semiconductor device, the workpiece 200 may be referred to herein as a semiconductor device 200 as the context requires. Throughout the present disclosure, like reference numerals denote like features, unless otherwise expressly excepted.

Figure 2:
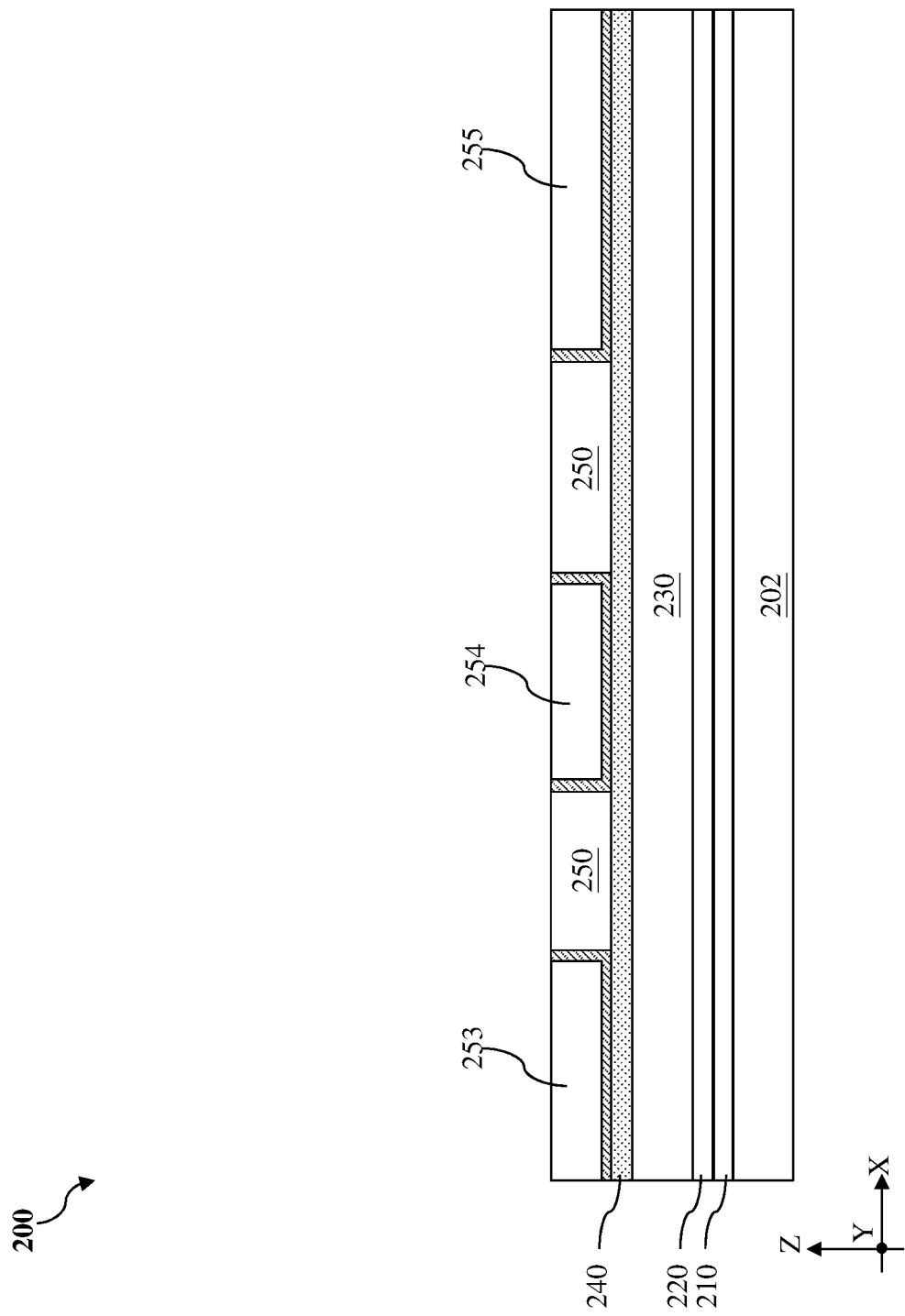
FIGS. 2-24 are fragmentary cross-sectional views of a workpiece at various stages of fabrication according to embodiments of the present disclosure.
Figure 3:
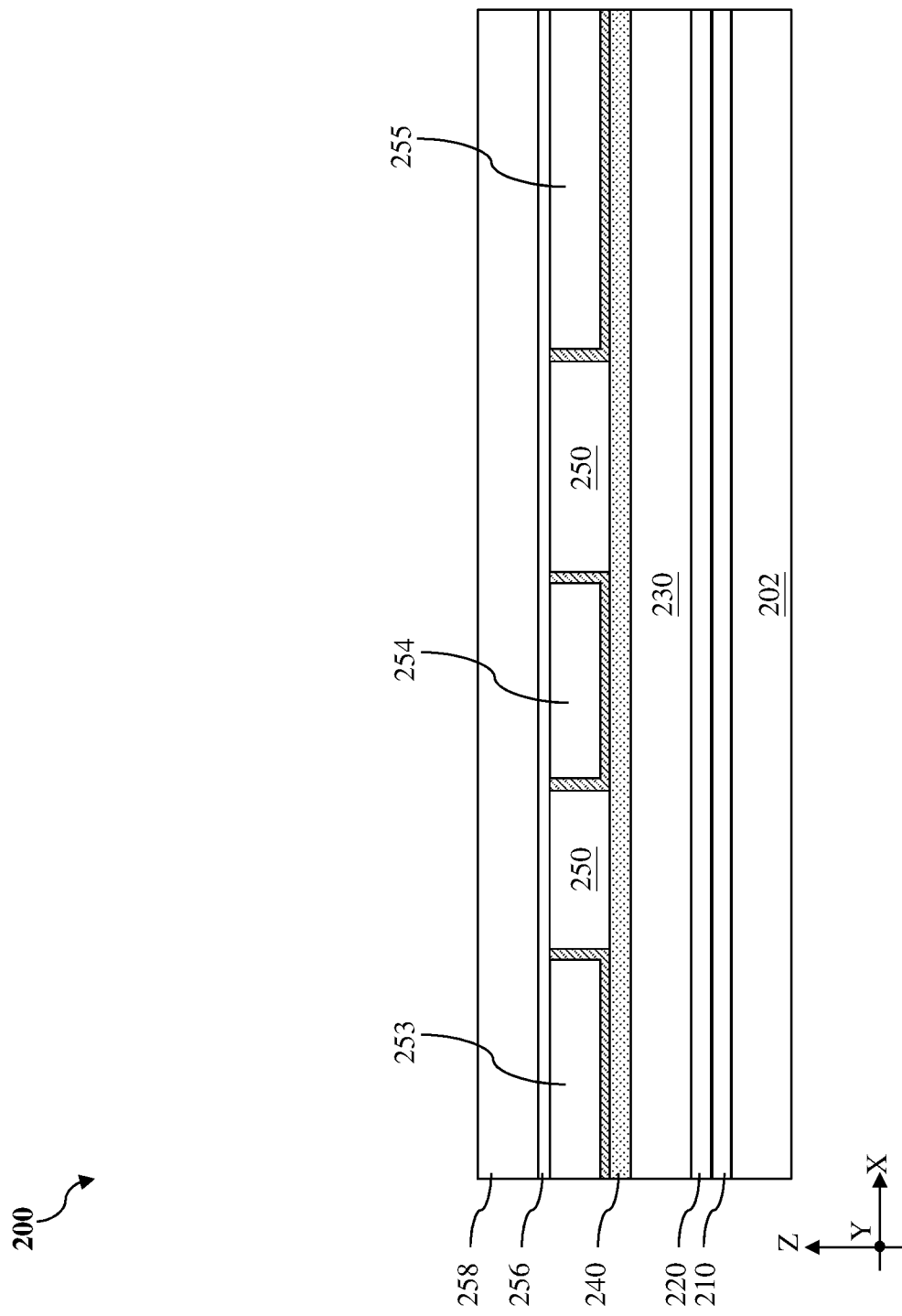

Referring to FIGS. 1 and 2, method 100 includes a block 102 where a workpiece 200 is provided. The workpiece 200 includes various layers already formed thereon. The workpiece 200 includes a substrate 202, which may be made of silicon or other semiconductor materials, such as germanium (Ge) or silicon germanium (SiGe). In some embodiments, the substrate 202 may include a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as silicon germanium (SiGe), silicon phosphorus carbide (SiPC), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); other group III-V materials; other group II-V materials; or combinations thereof. Alternatively, substrate 202 is a semiconductor-on-insulator substrate, such as a silicon-on-insulator (SOI) substrate or a germanium-on-insulator (GeOI) substrate. In some embodiments, the substrate 202 may include an epitaxial layer, for example an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components. Transistor components formed on the substrate 202 may include multi-gate devices, such as fin-type field effect transistors (FinFETs), nanowire transistors, nanosheet transistors, nanorod transistors, multi-bridge-channel (MBC) transistors, or other FETs with nanostructures. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

The workpiece 200 also includes an interconnect layer 210. The interconnect layer 210 may be one of the interconnect layers in a multi-layered interconnect (MLI) structure, which is formed over the substrate 202 and may include multiple patterned dielectric layers and conductive layers that provide interconnections (e.g., wiring) between the various microelectronic components of the workpiece 200. There may be intermediate layers or components between the interconnect layer 210 and the substrate 202, but in the interest of simplicity such layers or components are not shown. The multiple patterned dielectric layers may be referred to as intermetal dielectric (IMD) layers and may include silicon oxide or a low-k dielectric material whose k-value (dielectric constant) is smaller than that of silicon oxide, which is about 4. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. The conductive layers in the interconnect layer 210 may include contacts, vias, or metal lines.

A shown in FIG. 2, the workpiece 200 includes a carbide layer 220 disposed on the interconnect layer 210. The carbide layer 220 may include silicon carbide (SiC) or other carbide-containing dielectric materials. The workpiece 200 also includes an oxide layer 230 on the carbide layer 220. The oxide layer 230 may include an oxide-containing dielectric material, such as silicon oxide, or silicon oxynitride. In some alternative embodiments not explicitly shown in the figures, the interconnect layer 210, the carbide layer 220 and the oxide layer 230 may be replaced with one or more interconnect structures. An etch stop layer (ESL) 240 is disposed on the oxide layer 230. In some embodiments, the ESL 240 is about 45 to about 55 nm thick. The ESL 240 may include silicon carbonitride (SiCN), silicon oxycarbide (SiOC), silicon carbide (SiC), silicon oxycarbonitride (SiOCN), or silicon nitride (SiN), or combinations thereof. The workpiece 200 further includes a first dielectric layer 250 disposed on the ESL 240. In some embodiments, the first dielectric layer 250 includes undoped silica glass (USG) or silicon oxide. In some embodiments, the first dielectric layer 250 is about 800 to about 1000 nm thick.

Referring still to FIG. 2, the workpiece 200 includes one or more lower contact features (such as 253, 254, and 255) in the first dielectric layer 250. Although the lower contact features 253, 254, and 255 are disposed below upper contact features (to be discussed below), the lower contact features 253, 254, and 255 are sometimes referred to as top metal (TM) contacts because they may reside above transistor features (not shown in figures herein). Each of the lower contact features 253, 254, and 255 may include a barrier layer 2050 and a metal fill layer. In some embodiments, the barrier layer 2050 includes titanium nitride (TiN), tantalum (Ta), titanium (Ti), tantalum nitride (TaN), a suitable metal, a suitable metal nitride, or combinations thereof. In some embodiments, the metal fill layer includes a metal or metal alloy such as copper (Cu), cobalt (Co), nickel (Ni), aluminum (Al), tungsten (W), ruthenium (Ru), titanium (Ti), or combinations thereof. In the depicted embodiment, the lower contact features 253, 254, and 255 are formed of copper (Cu).

Figure 8:
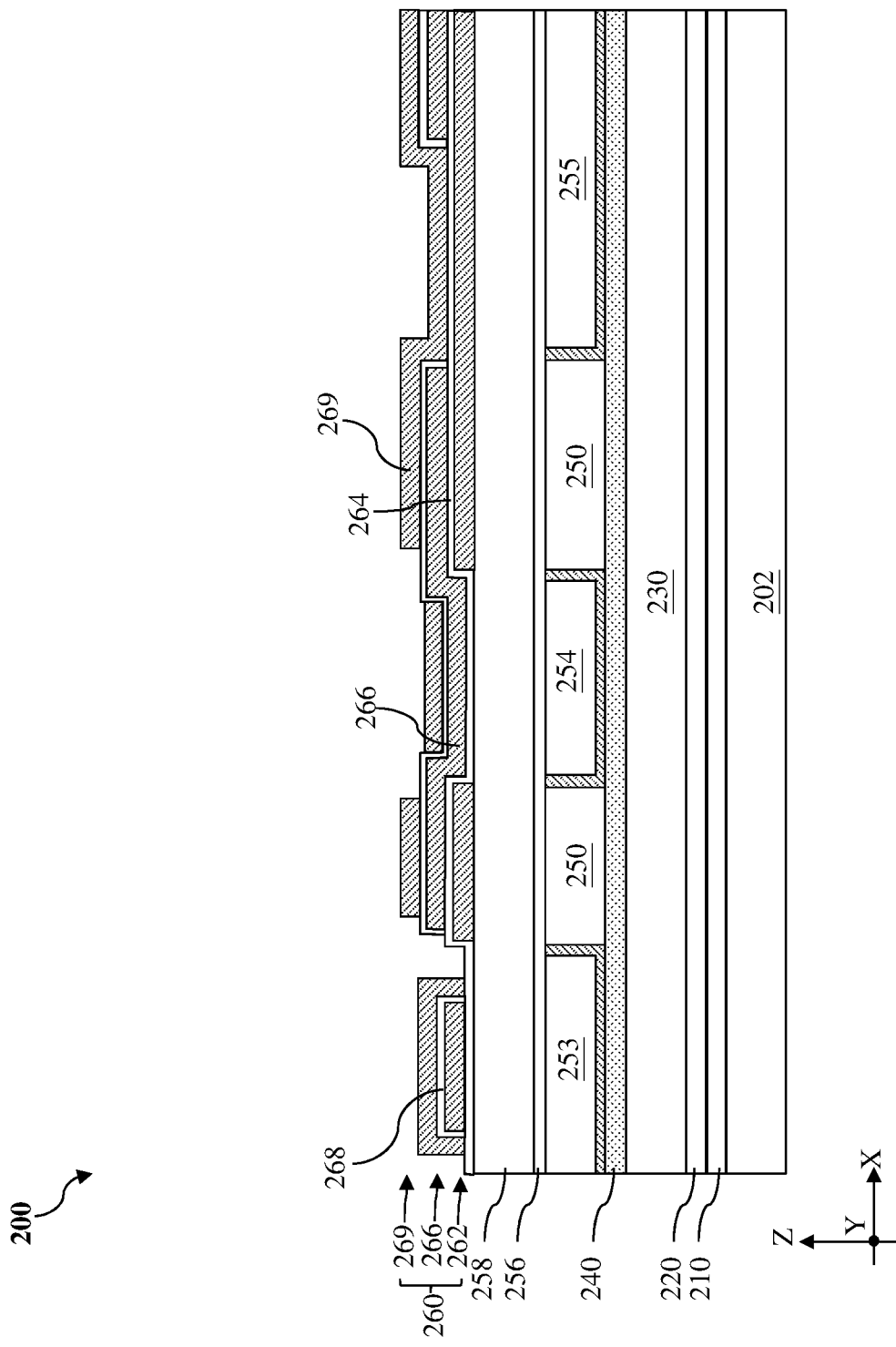

Referring to FIGS. 1 and 8, method 100 includes a block 104 where a second dielectric layer 256 and a third dielectric layer 258 are deposited over the lower contact features 253, 254, and 255. In some embodiments, the second dielectric layer 256 is about 65 to about 85 nm thick. The second dielectric layer 256 may include silicon carbonitride (SiCN), silicon nitride (SiN), and/or other suitable materials that may protect the lower contact features 253, 254, and 255 from being oxidized. The second dielectric layer 256 may be deposited using chemical vapor deposition (CVD). Also, at block 104, a third dielectric layer 258 is deposited over the second dielectric layer 256. In some embodiments, the third dielectric layer 258 is about 300 to about 500 nm thick. The third dielectric layer 258 may include an oxide material, such as undoped silica glass (USG), or other suitable material(s). The third dielectric layer 258 may be deposited using CVD, flowable CVD (FCVD), or spin-on coating.

Figure 4:
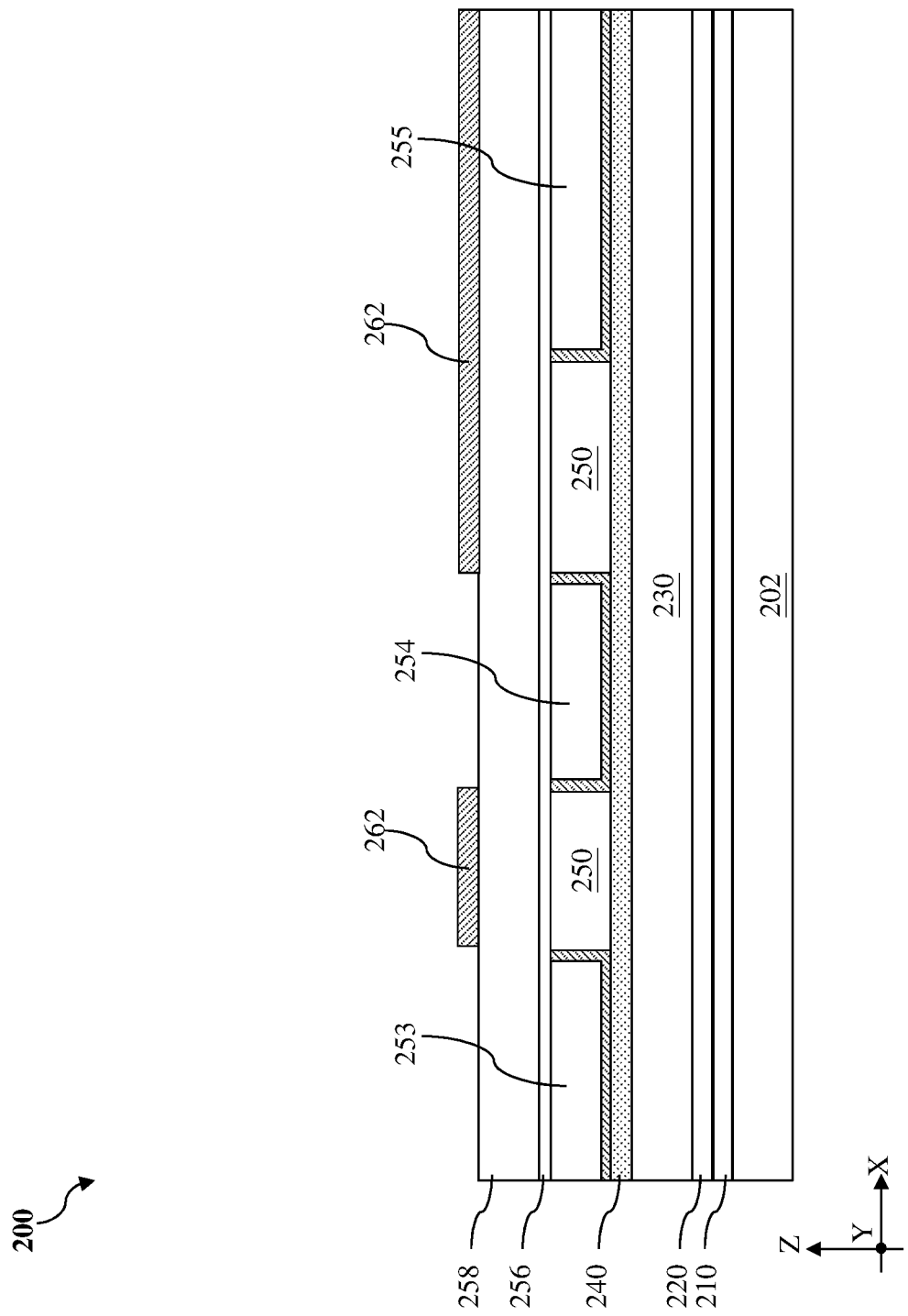
Figure 5:
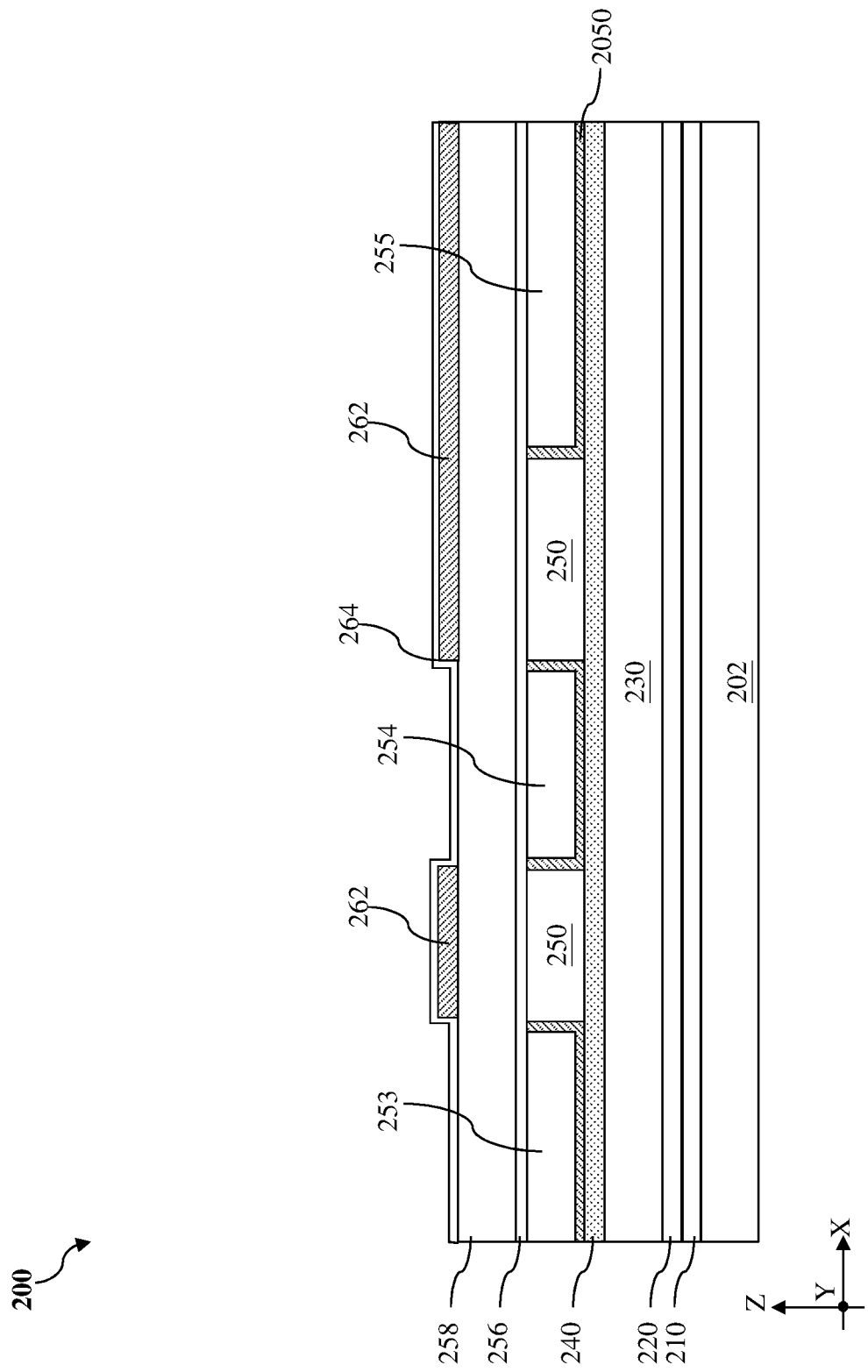
Figure 6:
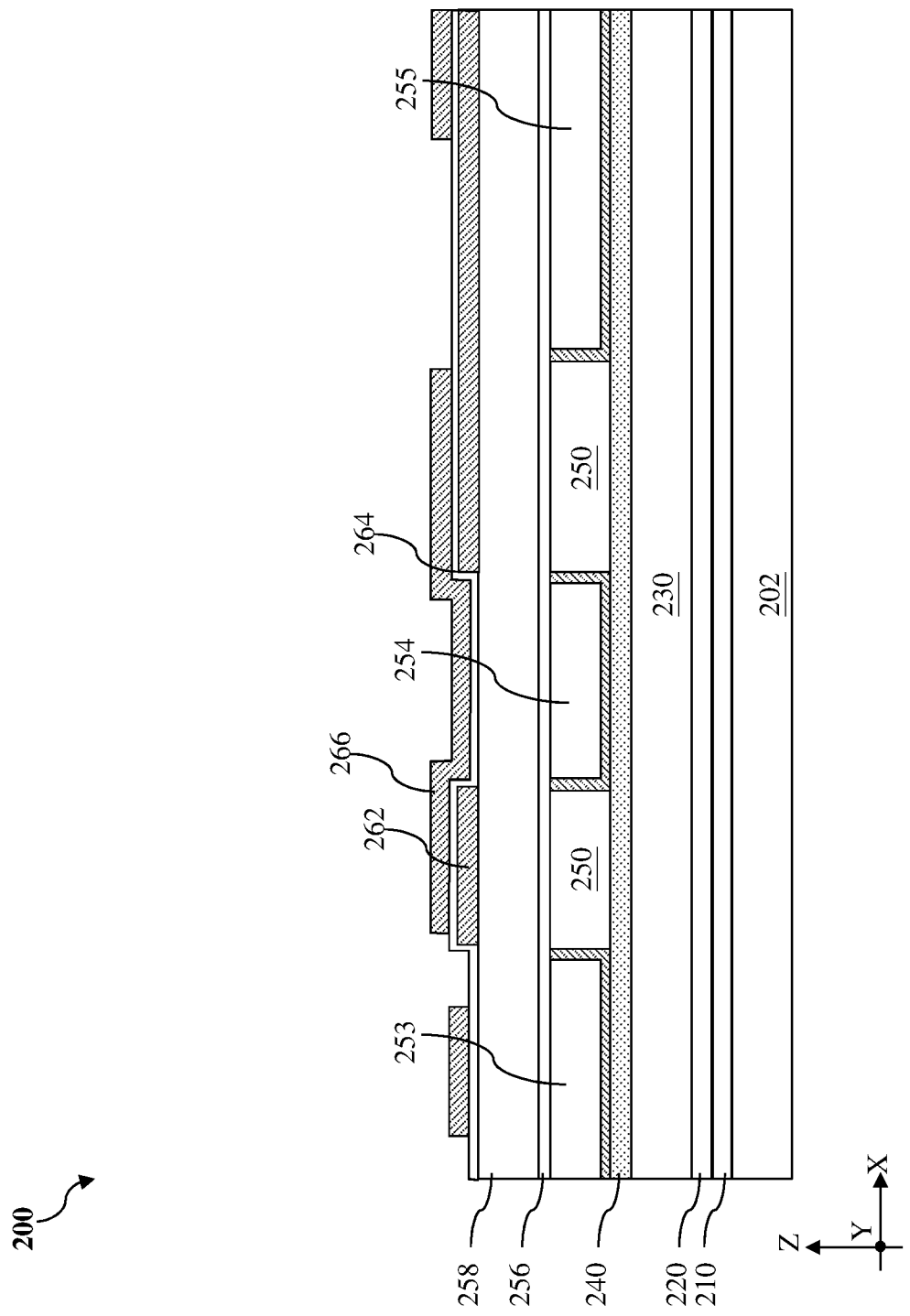
Figure 7:
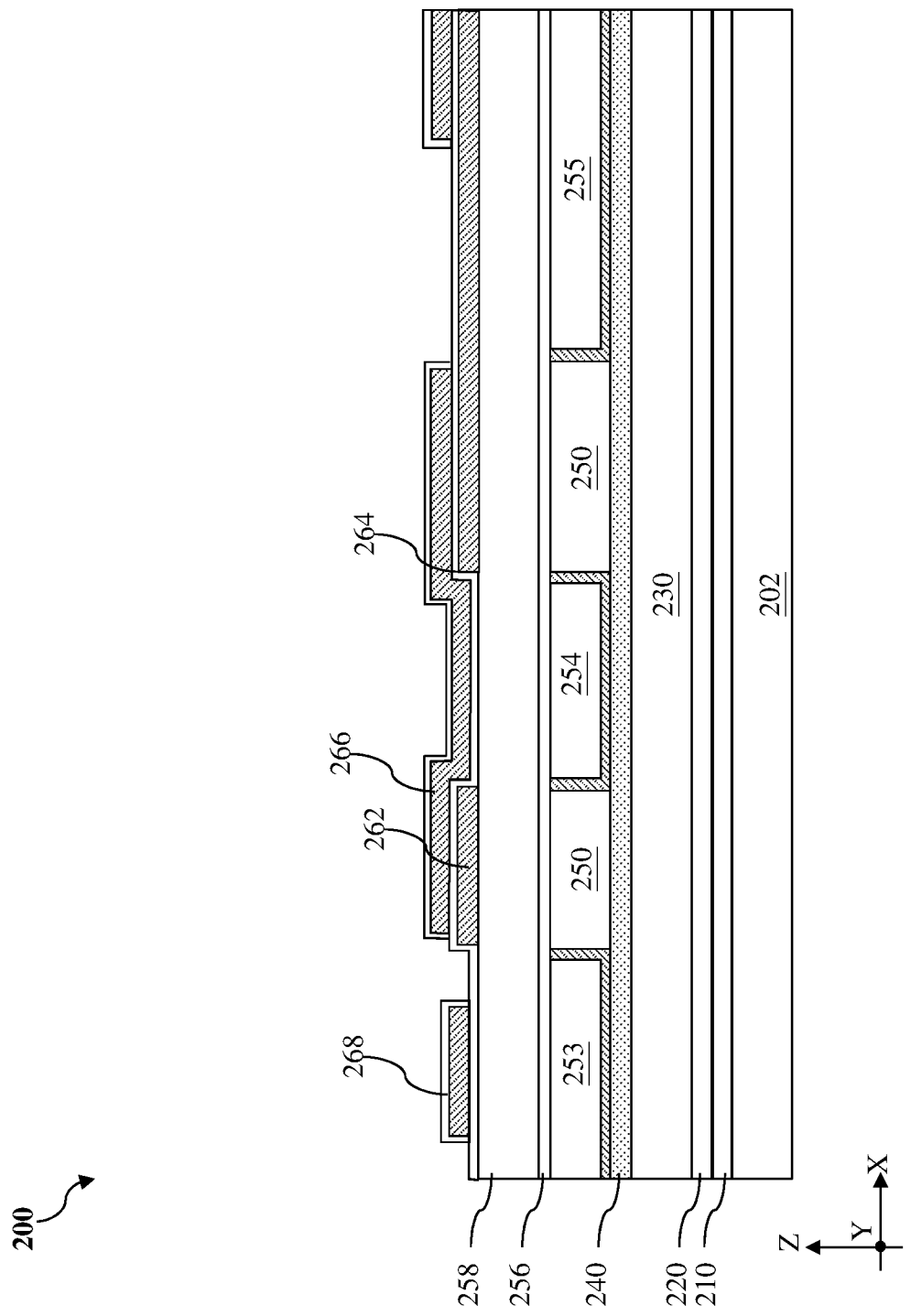

Referring to FIGS. 1 and 4-8, method 100 includes a block 106 where a metal-insulator-metal (MIM) structure 260 (shown in FIG. 8) is formed over the third dielectric layer 258. As shown in FIGS. 4-8, forming the MIM structure 260 involves multiple processes, including those for formation and patterning of a bottom conductor plate layer 262, a middle conductor plate layer 266, and a top conductor plate layer 269. Referring first to FIG. 4, a patterned bottom conductor plate layer 262 is formed on the third dielectric layer 258. Forming the bottom conductor plate layer 262 itself may involve multiple processes such as deposition, photolithography, development, and/or etching, etc. The bottom conductor plate layer 262 may go through surface treatment such as sidewall passivation using a nitrous oxide ($N_2O$) gas. In some embodiments, the bottom conductor plate layer 262 is about 35 to about 45 nm thick. Referring now to FIG. 5, a first insulator layer 264 is formed on the bottom conductor plate layer 262. In an embodiment, the first insulator layer 264 is deposited to have a generally uniform thickness over the top surface of the workpiece 200 (e.g., having about the same thickness on top and sidewall surfaces of the bottom conductor plate layer 262). Referring then to FIG. 6, a patterned middle conductor plate layer 266 is formed on the first insulator layer 264. The middle conductor plate layer 266 may be formed in a way similar to the way the bottom conductor plate layer 262 is formed, but the pattern of the middle conductor plate layer 266 may be different from that of the bottom conductor plate layer 262. Referring now to FIG. 7, a second insulator layer 268 is formed on the middle conductor plate layer 266. In an embodiment, the second insulator layer 268 is deposited to have a generally uniform thickness over the top surface of the workpiece 200 (e.g., having about the same thickness on top and sidewall surfaces of the middle conductor plate layer 266). Referring to FIG. 8, a patterned top conductor plate layer 269 is formed on the second insulator layer 268. The top conductor plate layer 269 may be formed in a way similar to the way the middle conductor plate layer 266 or the bottom conductor plate layer 262 is formed, but the pattern of the top conductor plate layer 269 may be different from that of the middle conductor plate layer 266 or the bottom conductor plate layer 262.

As illustrated in FIG. 8, the MIM structure 260 includes multiple metal layers including the bottom conductor plate layer 262, the middle conductor plate layer 266, and the top conductor plate layer 269, which function as metal plates of capacitors. The MIM structure 260 also includes multiple insulator layers including the first insulator layer 264 disposed between the bottom conductor plate layer 262 and the middle conductor plate layer 266, as well as the second insulator layer 268 disposed between the middle conductor plate layer 266 and the top conductor plate layer 269. The MIM structure 260 is used to implement one or more capacitors, which may be connected to other electric components such as transistors. The multi-layer MIM structure 260 allows capacitors to be closely packed together in both vertical and lateral directions, thereby reducing the amount of lateral space needed for implementing capacitors. As a result, the MIM structure 260 may accommodate super high-density capacitors and may be referred to as an MIM capacitor.

In some embodiments, to increase capacitance values, the first insulator layer 264 and/or the second insulator layer 268 use high-k dielectric material(s) whose k-value is greater than that of silicon oxide. The first and second insulator layers 264 and 268 may be relatively thin to increase capacitance values but maintain minimal thicknesses to avoid potential breakdown of the capacitors in the MIM structure 260. In some embodiments, each of the first and second insulator layers 264 and 268 is about 50 to about 70 nm thick. Further, to optimize the capacitor performance, in some embodiments, the first insulator layer 264 (or the second insulator layer 268) is a tri-layer structure including, from bottom to top, a first zirconium oxide ($ZrO_2$) layer, an aluminum oxide ($Al_2O_3$) layer, and a second zirconium oxide ($ZrO_2$) layer, where each of the layers is about 15 to about 25 nm thick.

Figure 9:
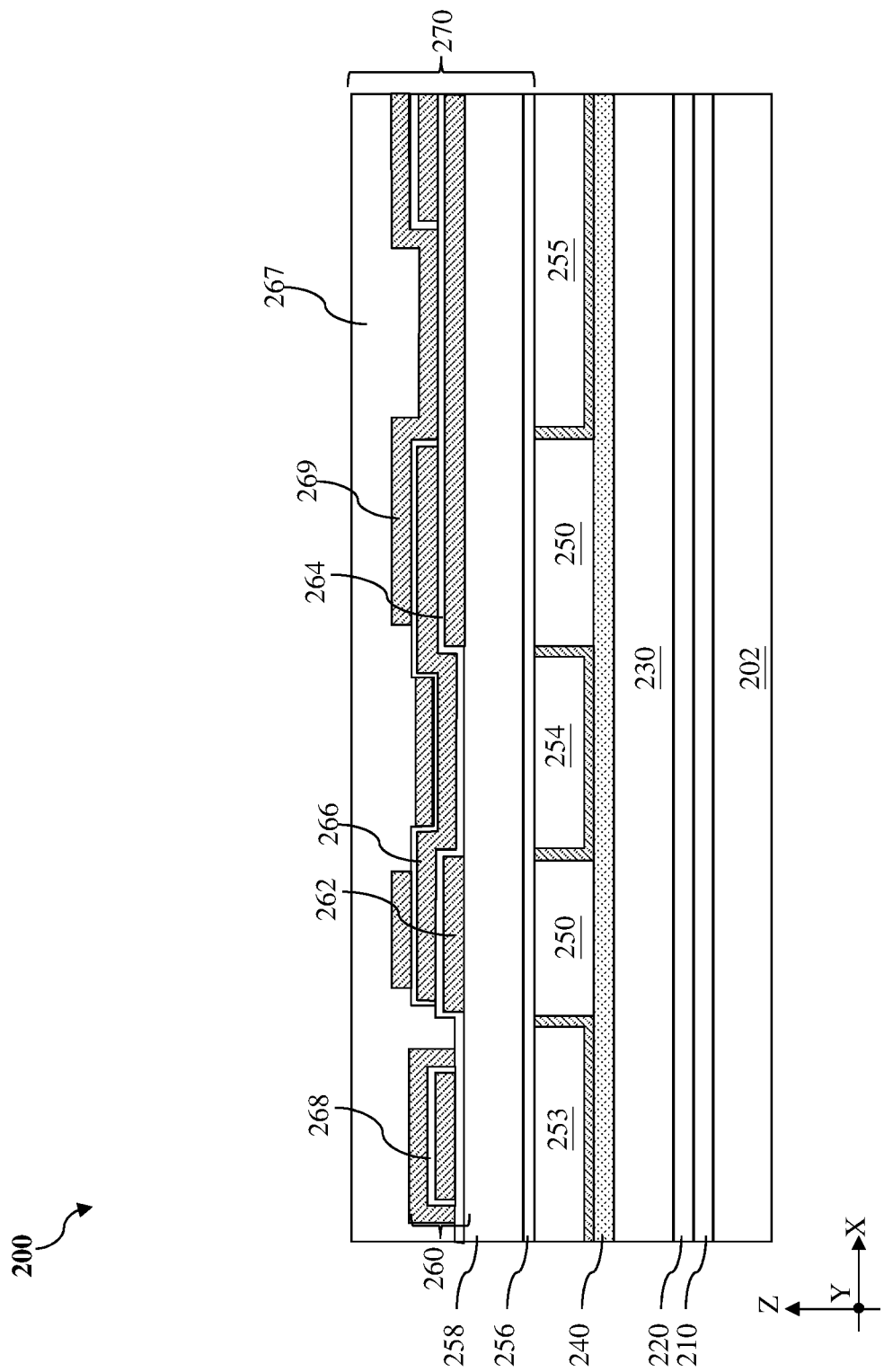

Referring to FIGS. 1 and 9, method 100 includes a block 108 where a fourth dielectric layer 267 is deposited over the MIM structure 260. In some embodiments, the fourth dielectric layer 267 is about 400 to about 500 nm thick. In some embodiments, the third dielectric layer 258 may include an oxide material, such as undoped silica glass (USG), or other suitable material(s). In some embodiments, the fourth dielectric layer 267 is formed by depositing about 900 to about 1000 nm of the oxide material, followed by a CMP process to reach the final thickness. As shown in FIG. 9, the MIM structure 260 is sandwiched between the third dielectric layer 258 and the fourth dielectric layer 267, which may have the same material. In some embodiments, the second dielectric layer 256, the third dielectric layer 258, the MIM structure 260, and the fourth dielectric layer 267 are regarded as parts of a first passivation structure 270. The various dielectric layers in the first passivation structure 270 protect the MIM structures 260 from damages due to crack propagation.

Figure 10:
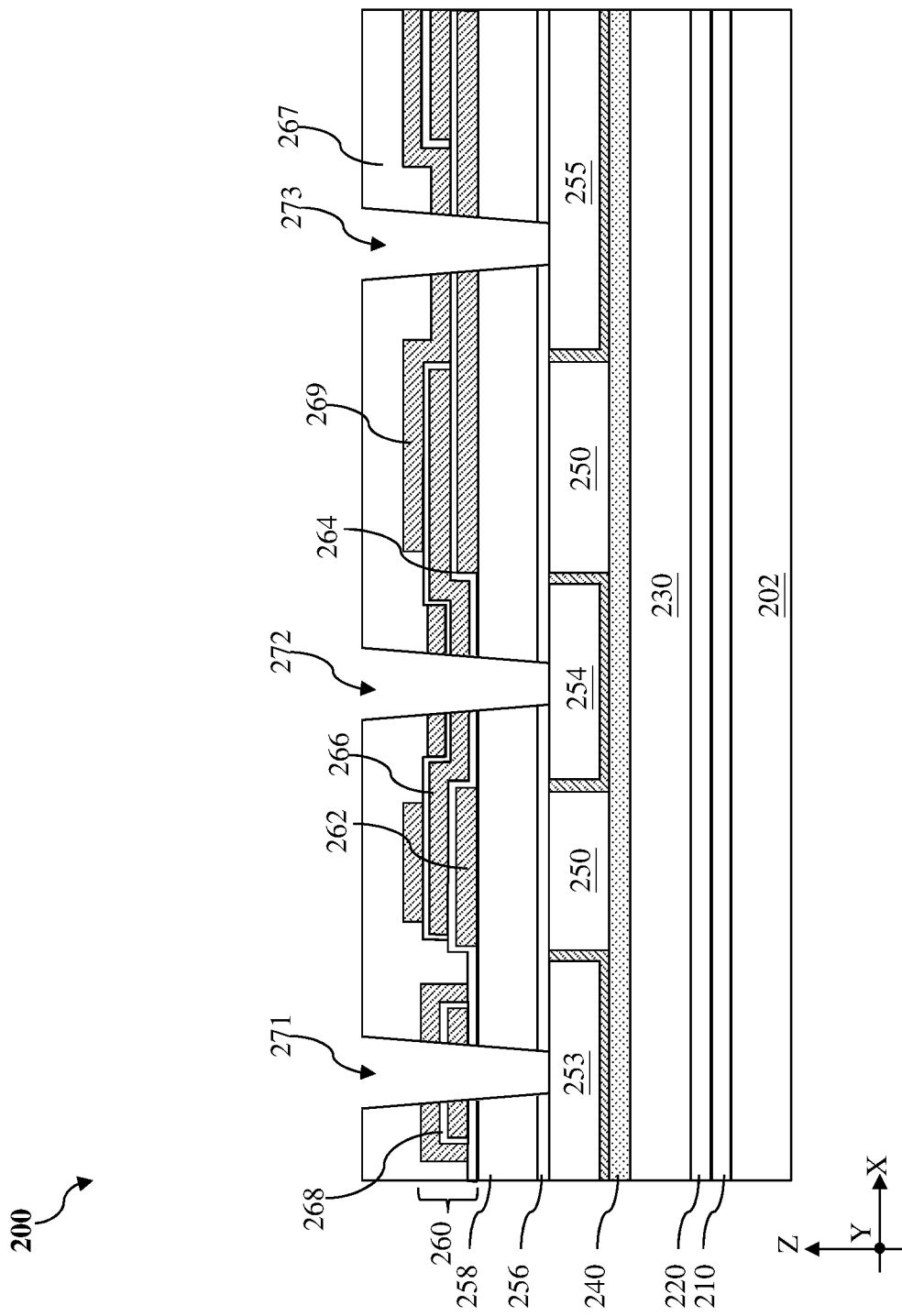

Referring to FIGS. 1 and 10, method 100 includes a block 110 where one or more openings (such as openings 271, 272, and 273) are formed to penetrate through, from top to bottom, the fourth dielectric layer 267, the MIM structure 260, the third dielectric layer 258, and the second dielectric layer 256. The openings 271, 272, and 273 expose top surfaces of the lower contact features 253, 254, and 255, respectively. In some embodiments, a dry etching process is performed to form the openings 271, 272, and 273. Depending on the application, the sidewall of each opening may expose different conductor plate layers of the MIM structure 260. The one or more openings (such as openings 271, 272, and 273) may be formed using dry etching, such as reactive ion etching (RIE). In some embodiments, the formation of the one or more openings may include use of oxygen, an oxygen-containing gas, hydrogen, a fluorine-containing gas (e.g., $CF_4$, $SF_6$, $NF_3$, $BF_3$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 11:
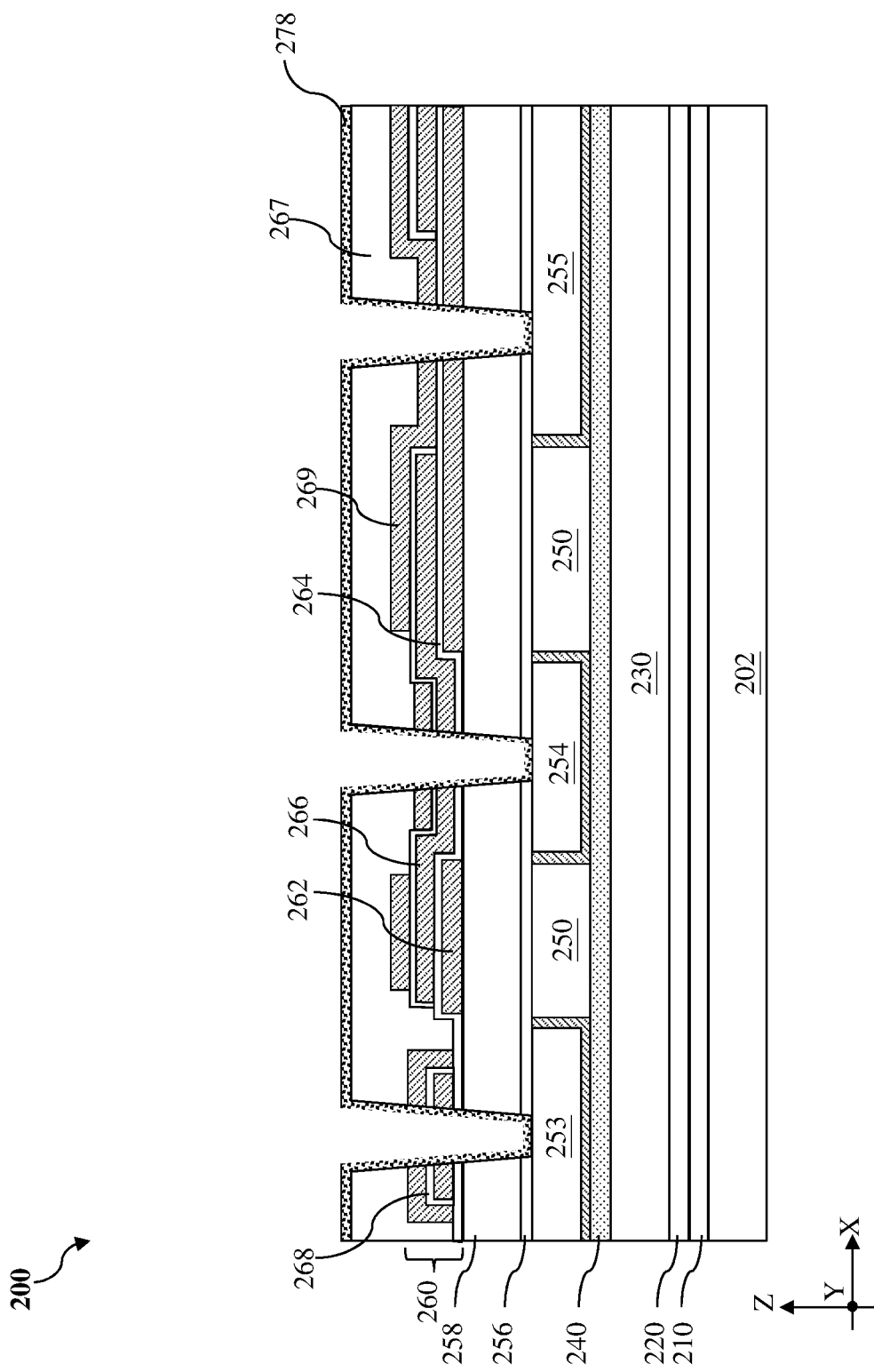

Referring to FIGS. 1 and 11, method 100 includes a block 112 where a seed layer 278 is formed over the workpiece 200. In some embodiments, the seed layer 278 may include titanium (Ti), titanium nitride (TiN), tantalum nitride (TaN), tantalum (Ta), copper (Cu), or a combination thereof. The seed layer 278 may have a thickness between about 1 nm and about 5 nm. In one embodiment, the seed layer 278 may include tantalum nitride (TaN), tantalum (Ta) and copper (Cu). The seed layer 278 may also serve as a barrier layer to retard or prevent oxygen diffusion from the fourth dielectric layer 267 into the lower contact features (the lower contact features 253, 254, and 255). The seed layer 278 may be conformally deposited over the fourth dielectric layer 267 and into the openings 271, 272 and 273 using a suitable deposition technique, such as atomic layer deposition (ALD), physical vapor deposition (PVD) or chemical vapor deposition (CVD).

Figure 12:
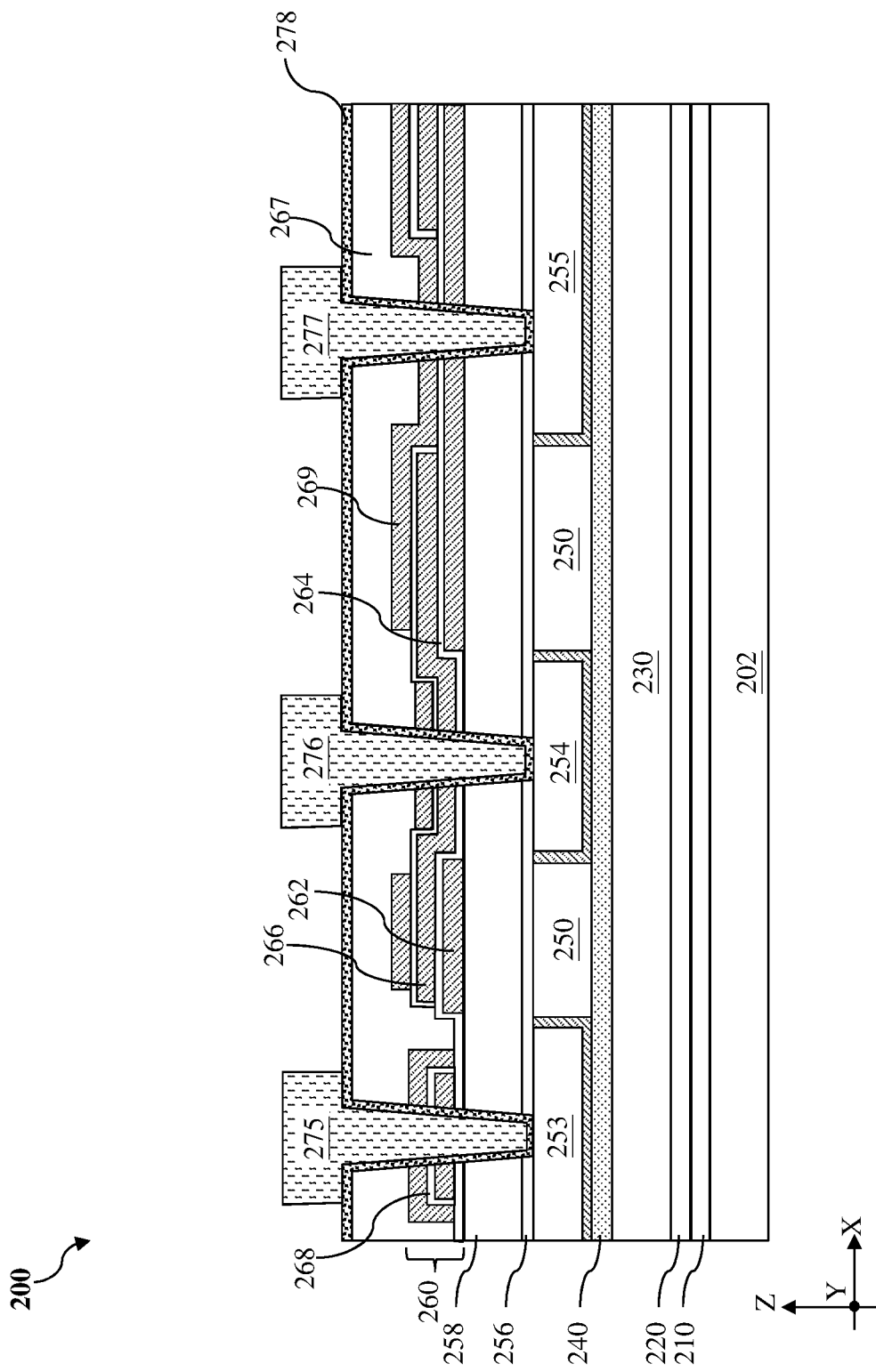

Referring to FIGS. 1 and 12, method 100 includes a block 114 where upper contact features 275, 276 and 277 are formed in and over the openings 271, 272 and 273. After the deposition of the seed layer 278, a metal fill layer is deposited over the seed layer 278 using a suitable deposition technique, such as ALD, PVD or ALD. The metal fill layer may include copper (Cu), aluminum (Al), or a combination thereof. In the depicted embodiment, the metal fill layer is formed of copper (Cu). The deposited metal fill layer is then patterned to form upper contact features 275, 276 and 277, as illustrated in FIG. 12. During the patterning of the upper contact features 275, 276 and 277, the seed layer 278 may serve as an etch stop layer (ESL) to signal an etching end point. In embodiments represented in FIG. 12, portions of the upper contact features 275, 276 and 277 above the fourth dielectric layer 267 have substantially straight sidewalls. In other embodiments not explicitly shown in the figures, portions of the upper contact features 275, 276 and 277 above the fourth dielectric layer 267 have tapered sidewalls. For ease of reference, the upper contact features 275, 276 and 277 may also be referred to as conductive features 275, 276 and 277.

At least the upper portion of the upper contact features 275, 276, and 277 that rise above the fourth dielectric layer 267 are part of a redistribution layer (RDL) to reroute bond connections between upper and lower layers. The upper contact features 275, 276, and 277 each penetrate through, from top to bottom, the fourth dielectric layer 267, the MIM structure 260, the third dielectric layer 258, and the second dielectric layer 256. The upper contact features 275, 276, and 277 make electrical contact with the lower contact features 253, 254, and 255, respectively. In the depicted embodiments, the upper contact feature 275 is electrically coupled to dummy plates of the MIM structure 260 that are insulated from the functional portion of the MIM structure 260. The upper contact feature 276 is electrically coupled to the middle conductor plate layer 266 and serves as a middle plate (MP) contact via. The upper contact feature 277 is electrically coupled to the bottom conductor plate layer 262 and the top conductor plate layer 269 and serves as a top-plate-middle-plate (TPBP) contact via. In some instances, the capacitance of the MIM structure 260 is formed between the middle conductor plate layer, on the one hand, and the top conductor plate layer and the bottom conductor plate layer, on the other hand.

Figure 13:
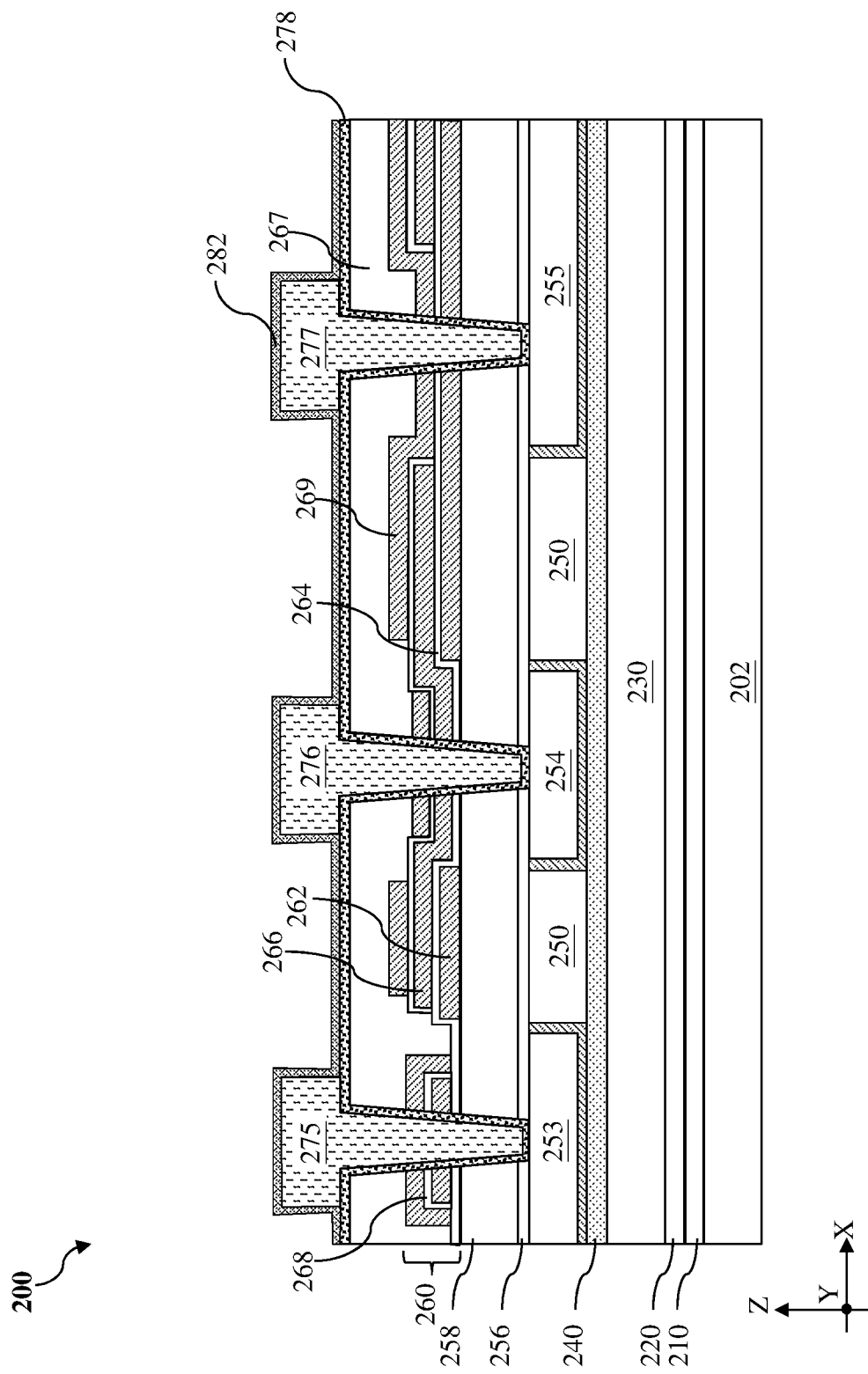
Figure 14:
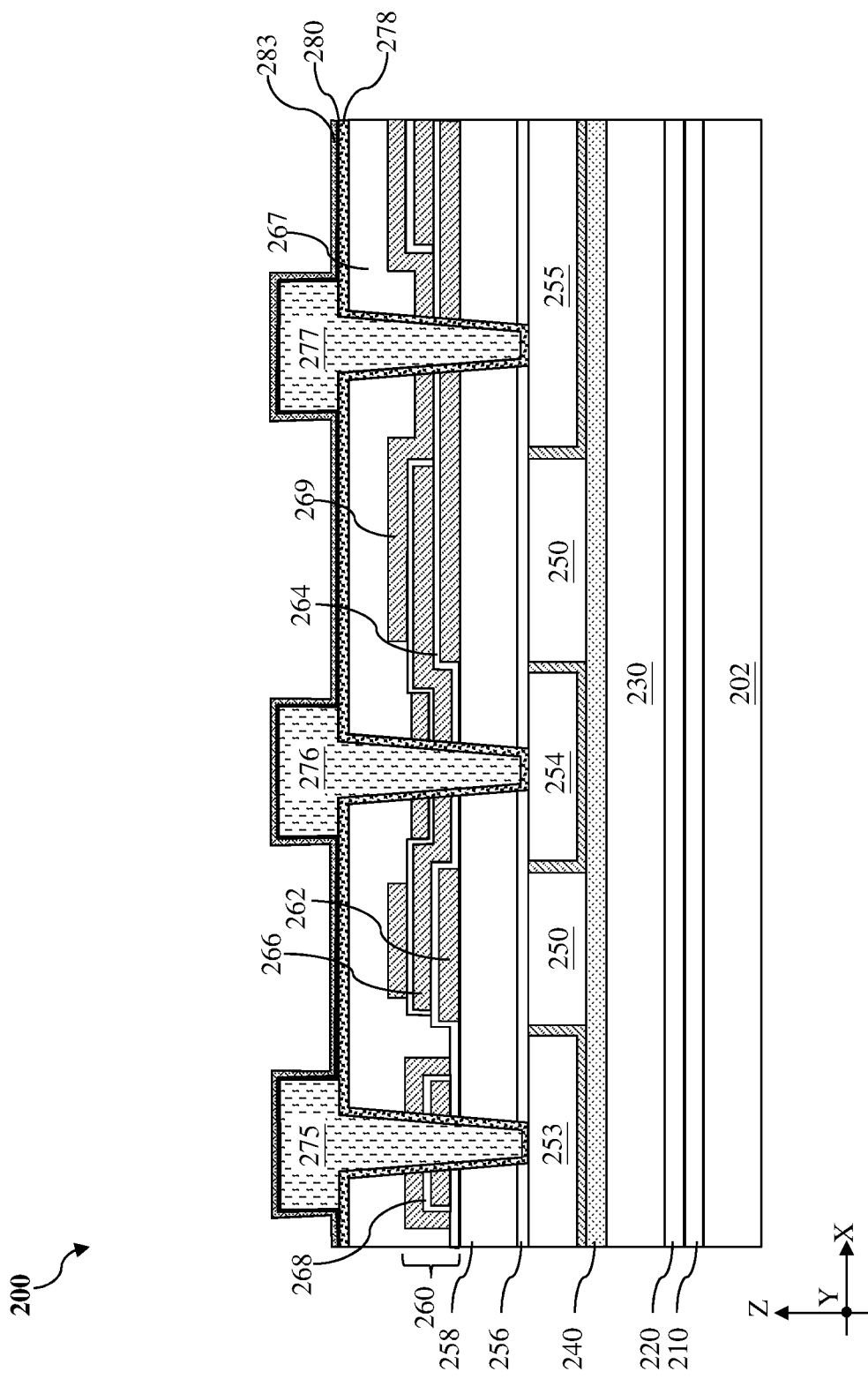
Figure 15:
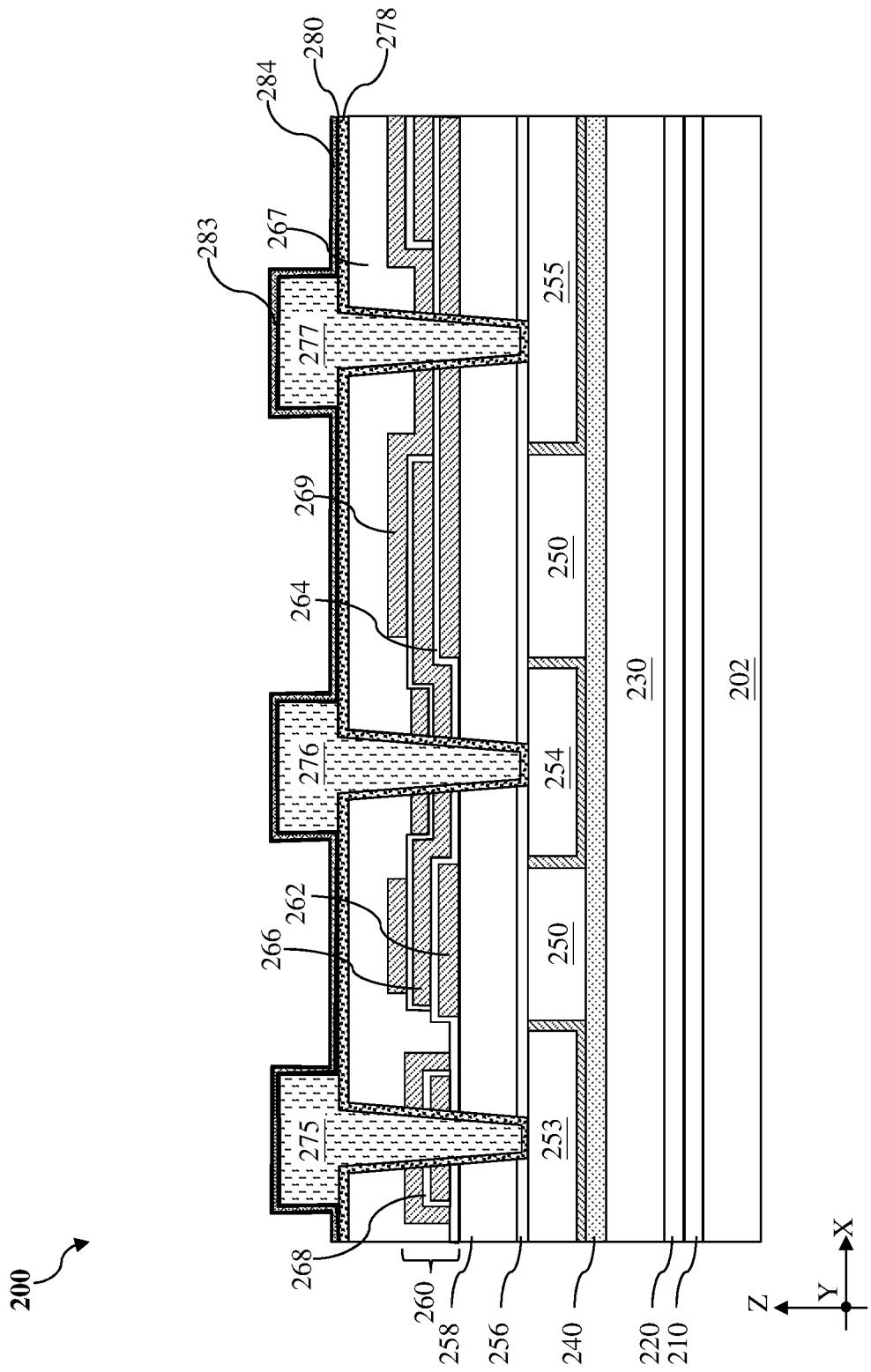

Referring to FIGS. 1, 13, 14, and 15, method 100 includes a block 116 where a protecting layer is formed over the workpiece 200, including over the upper contact features and the seed layer 278. As shown in example embodiments in FIGS. 13, 14 and 15, the protecting layer may be a single layer, a dial-layer, or a tri-layer. FIG. 13 illustrates a single-layer protecting layer 282 that is formed of silicon nitride. In some embodiments, the single-layer protecting layer 282 may be deposited using CVD or ALD. In the embodiment shown in FIG. 13, the single-layer protecting layer 282 has a thickness between about 2000 Å and about 3000 Å. FIG. 14 illustrates a dual-layer protecting layer that includes a first layer 280 and a second layer 283 over the first layer 280. In embodiments represented in FIG. 14, the first layer 280 includes silicon nitride and the second layer 283 includes silicon oxide. The first layer 280 and the second layer 283 may be deposited using CVD or ALD. In the embodiment shown in FIG. 14, a total thickness of the first layer 280 and the second layer 283 is between about 2000 Å and about 3000 Å. FIG. 15 illustrates a tri-layer protecting layer that includes the first layer 280, the second layer 283, and a third layer 284. In embodiments represented in FIG. 15, the first layer 280 and the third layer 284 include silicon nitride while the second layer 283 includes silicon oxide. In the embodiment shown in FIG. 15, a total thickness of the first layer 280, the second layer 283, and the third layer 284 is between about 2000 Å and about 3000 Å. It is noted, in all embodiments of the present disclosure, the upper contact features 275, 276, and 277 are all spaced apart from a silicon oxide layer, if one is present in the protecting layer. For example, in the dual-layer protecting layer embodiment and the tri-layer protecting layer embodiment, the second layer 283, which is formed of silicon oxide, is spaced apart from the upper contact features 275, 276, and 277 by the first layer 280, which is formed of silicon nitride.

Figure 16:
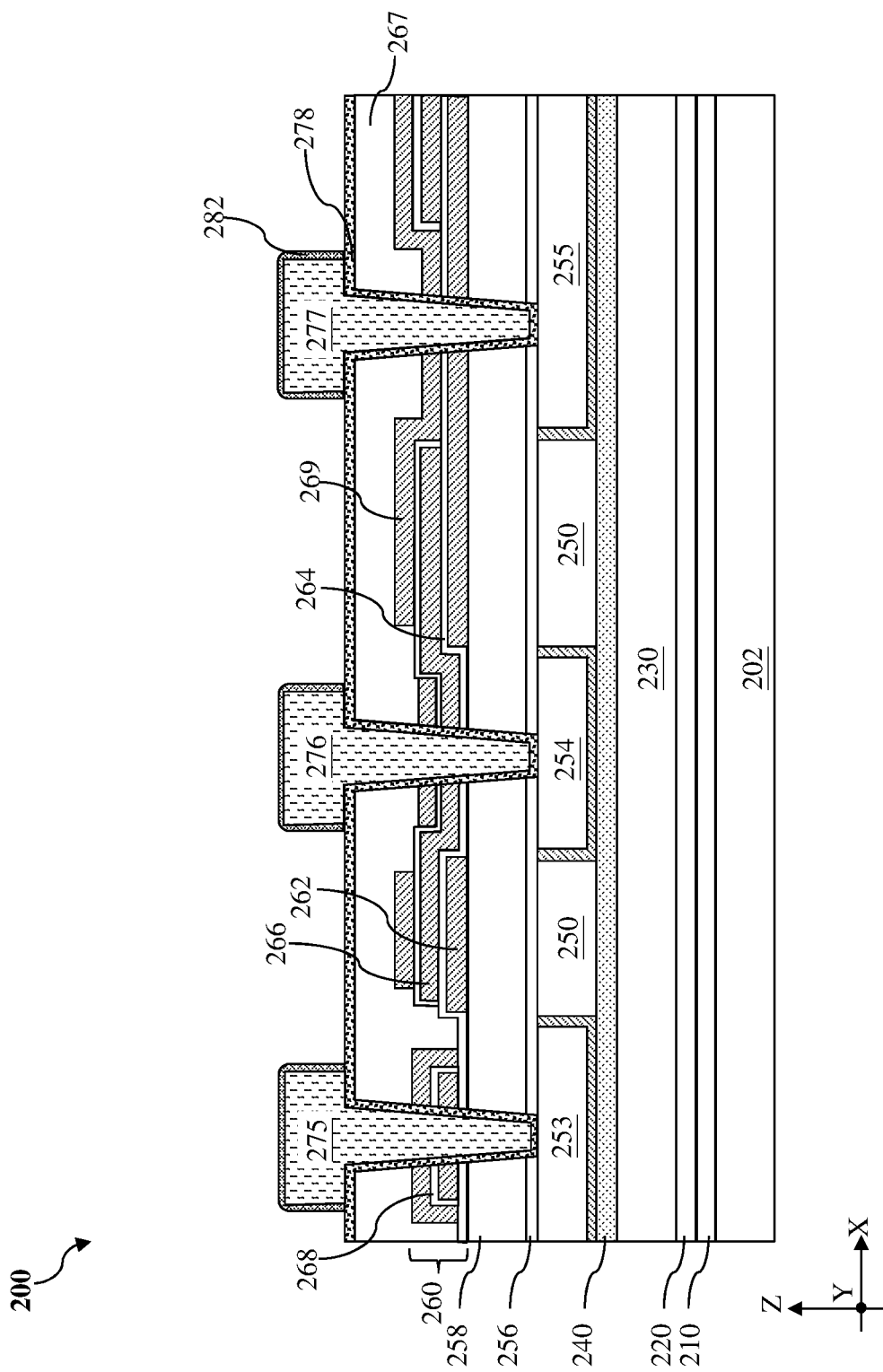
Figure 17:
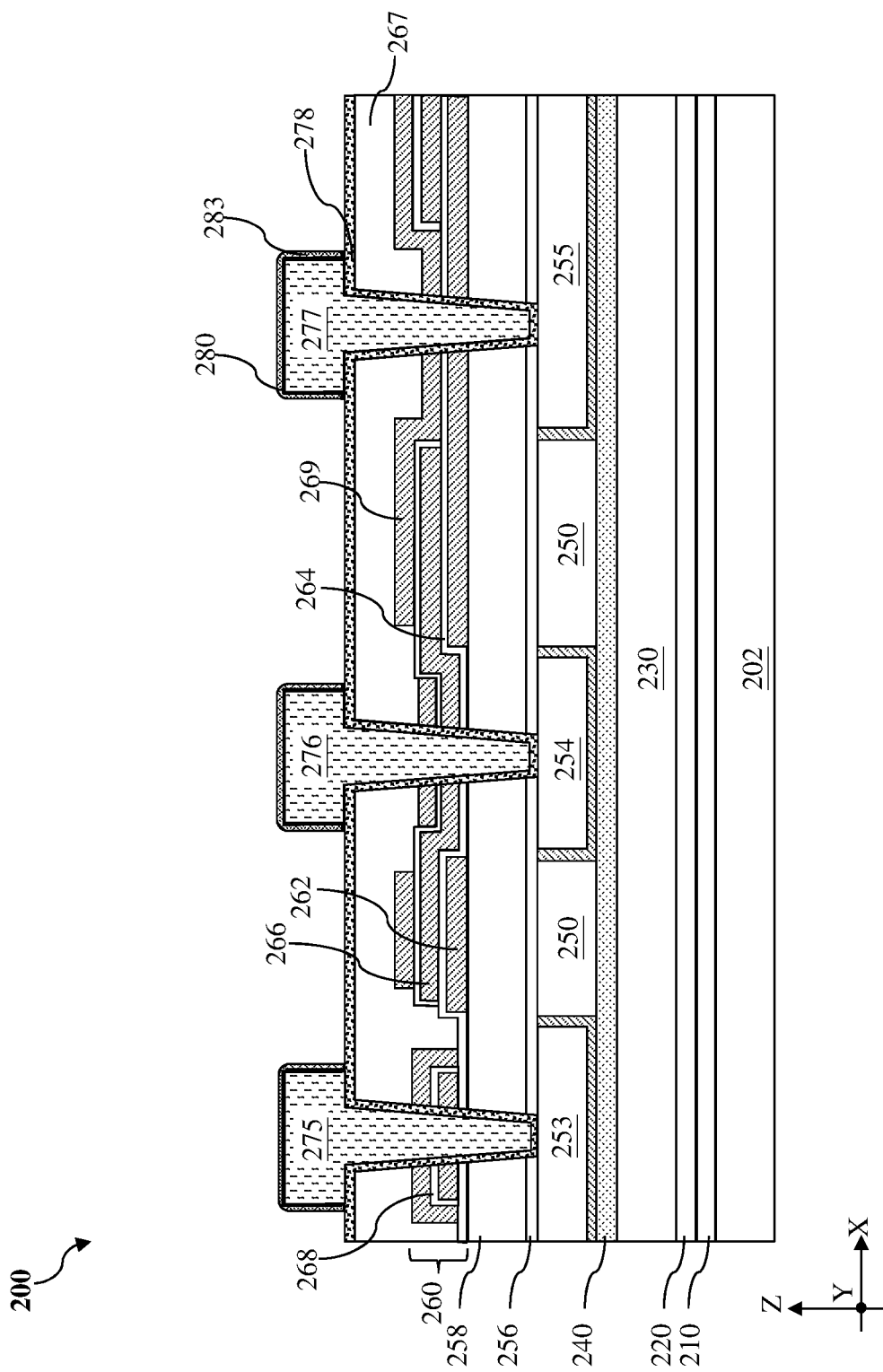
Figure 18:
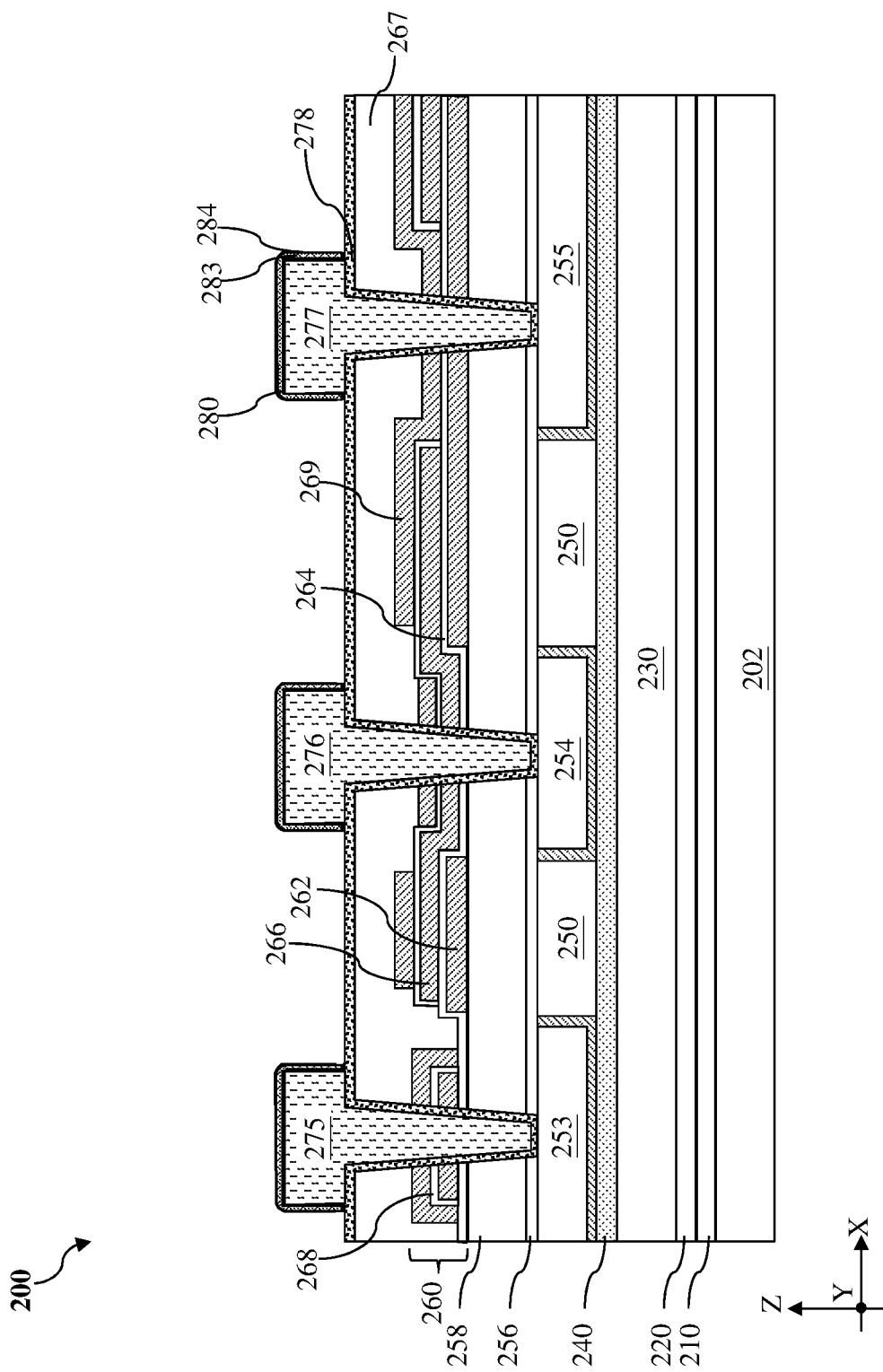

Referring to FIGS. 1, 16, 17, and 18, method 100 may optionally include a block 118 where the protecting layer is patterned using photolithography. In some embodiments, before the etching back of the seed layer 278, the protecting layer shown in FIG. 13, 14 or 15 is first patterned using photolithography and etching processes. As shown in FIGS. 16, 17 and 18, portions of the protecting layer that are not disposed over the top surface and sidewalls of the upper contact features 275, 276, and 277 are selectively removed. In an example process, a photoresist layer is formed over the protecting layer that is deposited blanketly over the workpiece 200. The photoresist layer is then patterned using photolithography techniques to form a patterned photoresist layer to cover the protecting layer on surfaces of the upper contact features 275, 276, and 277 and to expose portions of the protecting layer disposed between the upper contact features 275, 276, and 277. Then, using the patterned photoresist layer as an etch mask, the protecting layer is patterned, as shown in FIG. 16, 17 or 18. Upon conclusion of the operations at block 118, the patterned protecting layer is disposed over top surfaces and sidewalls of the upper contact features 275, 276 and 277 while the seed layer 278 between upper contact features 275, 276 and 277 is exposed. In the embodiments represented in FIG. 16, the protecting layer is a single layer and is disposed over surfaces of the upper contact features 275, 276, and 277. In the embodiments represented in FIG. 17, the protecting layer is a dual-layer and is disposed over surfaces of the upper contact features 275, 276, and 277. In the embodiments represented in FIG. 18, the protecting layer is a tri-layer and is disposed over surfaces of the upper contact features 275, 276, and 277.

Figure 19:
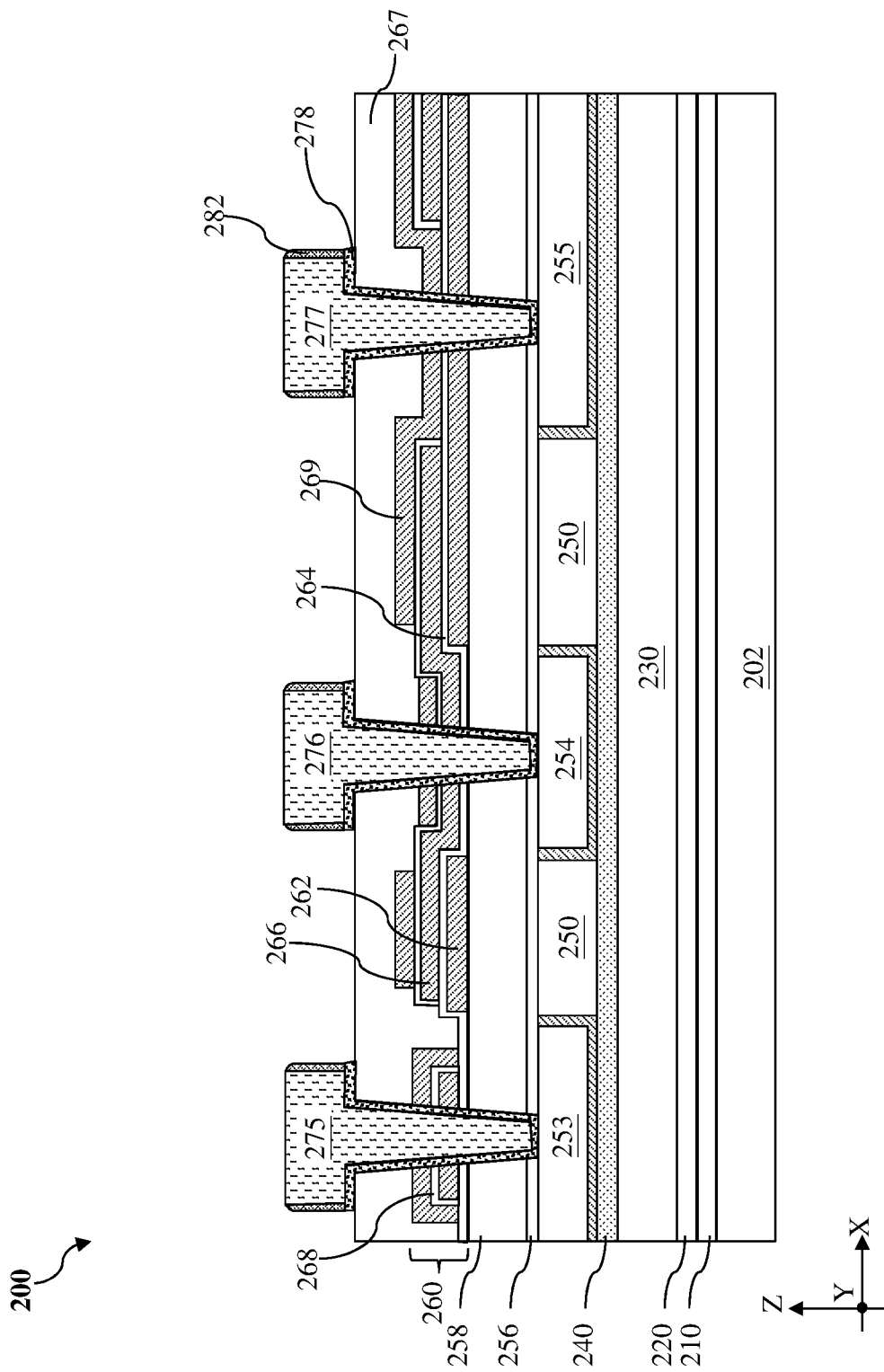
Figure 20:
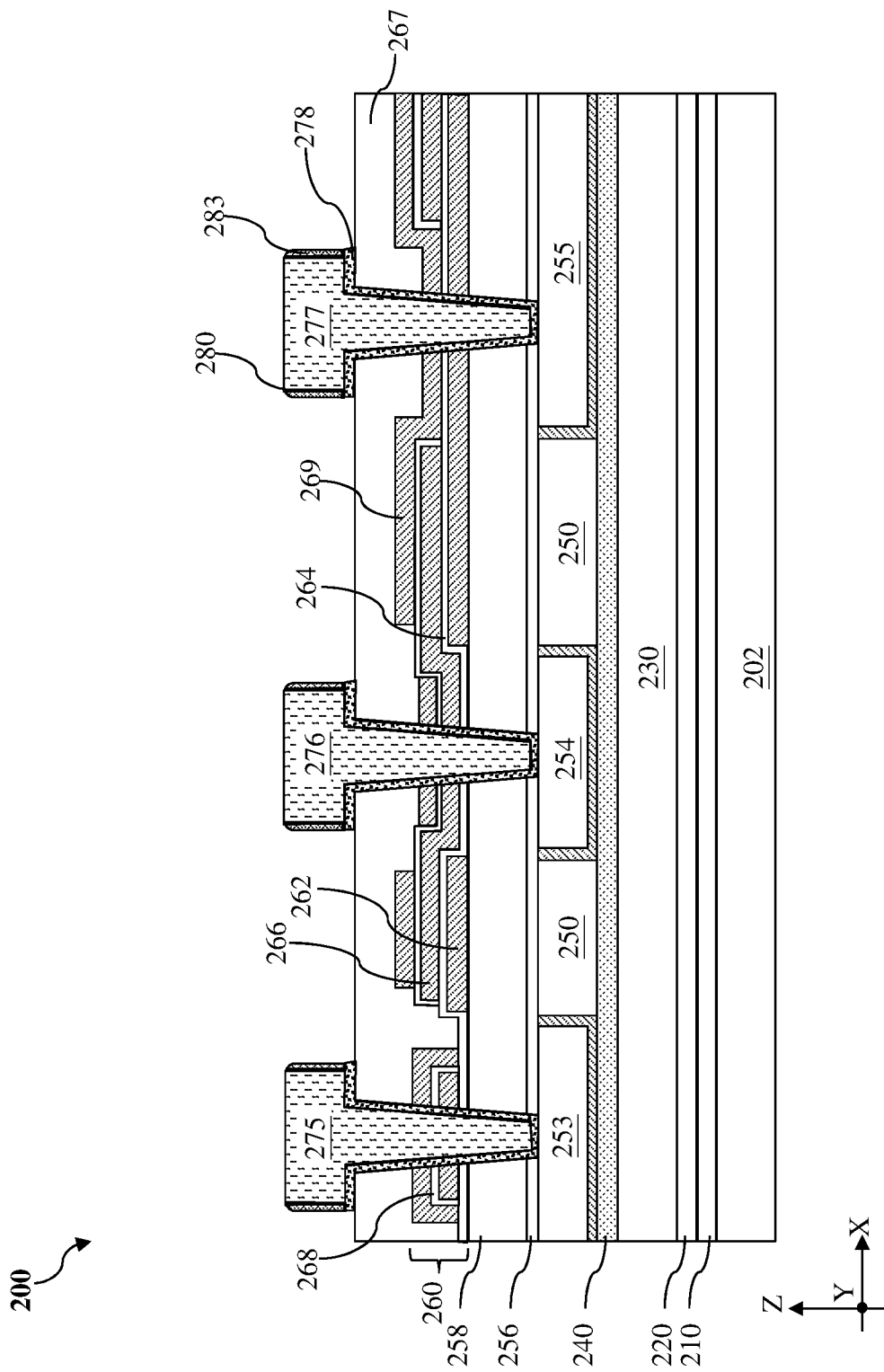
Figure 21:
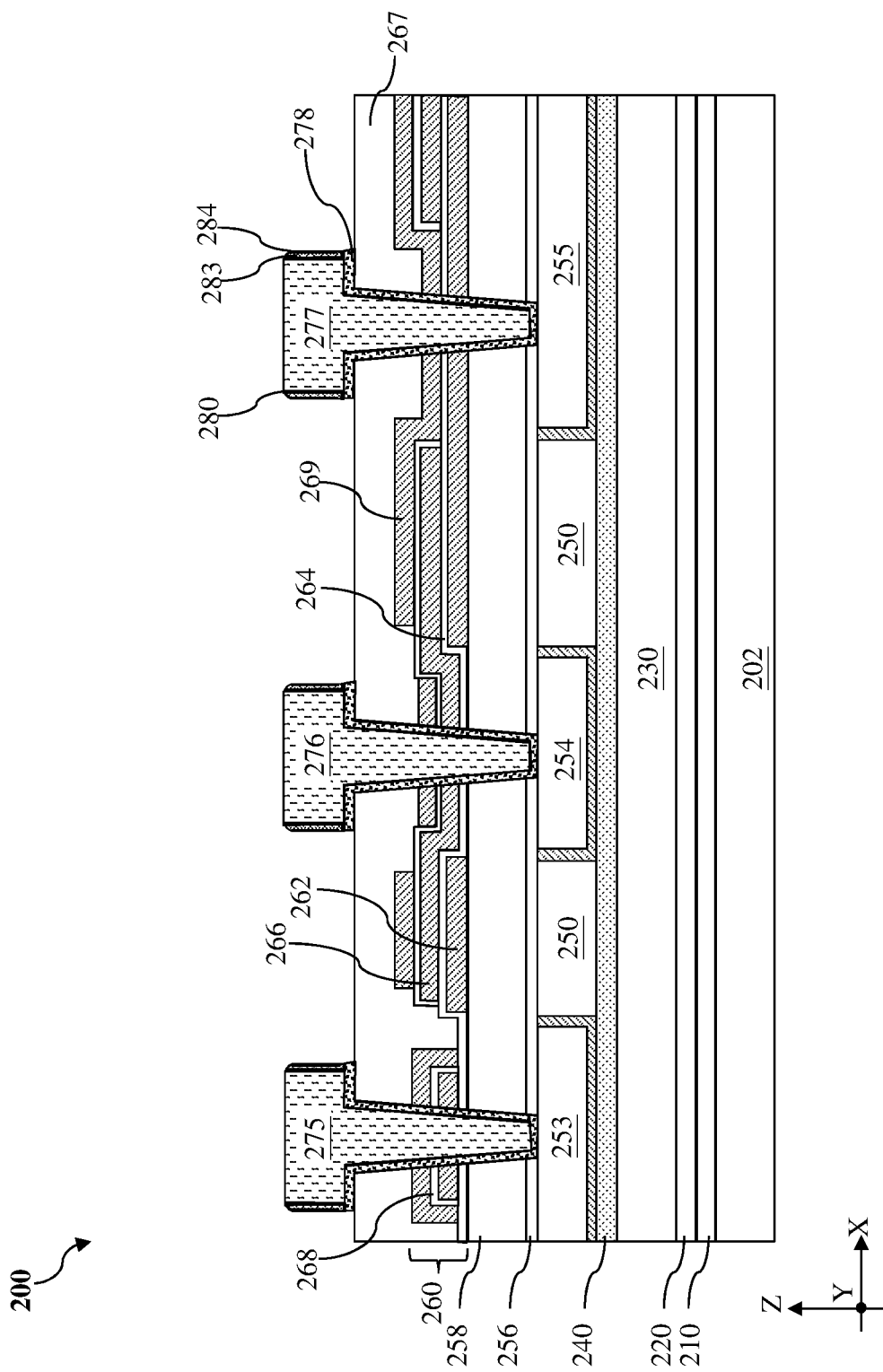

Referring to FIGS. 1, 19, 20, and 21, method 100 includes a block 120 where an etch back is performed. FIGS. 19, 20 and 21 illustrate the embodiments where the etch back at block 120 is performed to the protecting layer (i.e., single-layer protecting layer 282 when the protecting layer is a single layer, the first layer 280 and the second layer 283 when the protecting layer is a double-layer, the first layer 280, the second layer 283, and the third layer 284 when the protecting layer is a tri-layer) and the seed layer 278, with or without the optional operations at block 118. When operations at block 118 are omitted, the etch back at block 120 is performed to the workpiece 200 shown in FIG. 13, 14 or 15, depending on the construction of the protecting layer. When operations at block 118 are performed to the workpiece 200 shown in FIG. 16, 17 or 18, depending on the construction of the protecting layer. In some embodiments, the etch back at block 118 is intended to remove the protecting layer on top surfaces of the upper contact features 275, 276 and 277 to expose the top surfaces of the upper contact features, while sidewalls of the upper contact features 275, 276 and 277 remain protected by the protecting layer. When operations at the optional block 118 are not performed, the upper contact features 275, 276 and 277 may sustain more thickness loss along the Z direction but their widths along the X direction are maintained due to the presence of the protecting layer.

Because both the seed layer 278 and the protecting layer may include nitride (for example, the seed layer 278 may include tantalum nitride and the protecting layer may include at least one layer formed of silicon nitride), the etch back at block 120 may include chemistry that is selective to metal nitride and silicon nitride. In some implementations, the etch back at block 120 may include a dry etch process that uses nitrogen ($N_2$), oxygen ($O_2$), hydrogen ($H_2$), a fluorine-containing gas (e.g., $CF_4$, $SF_6$, $NF_3$, $BF_3$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Referring to FIGS. 19, 20 and 21, the protecting layer and the seed layer 278 that are disposed on top-facing surfaces are removed by the etch back at block 120 while sidewalls of the upper contact features 275, 276, and 277 are protected by the protecting layer. In embodiments where the protecting layer is a single layer as shown in FIG. 19, after the etch back at block 120, the single-layer protecting layer 282 is disposed along sidewalls of the upper contact features 275, 276, and 277. A portion of the seed layer 278 is disposed below the single-layer protecting layer 282. After the etch back, the thickness of the single-layer protecting layer 282 (as measured from sidewalls of the upper contact features 275, 276, and 277) may be between about 500 Å and about 3000 Å. In embodiments where the protecting layer is a double layer as shown in FIG. 20, after the etch back at block 120, the first layer 280 and the second layer 283 are disposed along sidewalls of the upper contact features 275, 276, and 277. A portion of the seed layer 278 is disposed below the first layer 280 and the second layer 283. After the etch back, the total thickness of the first layer 280 and the second layer 283 (as measured from sidewalls of the upper contact features 275, 276, and 277) may be between about 500 Å and about 3000 Å. In embodiments where the protecting layer is a tri-layer as shown in FIG. 21, after the etch back at block 120, the first layer 280, the second layer 283, and the third layer 284 are disposed along sidewalls of the upper contact features 275, 276, and 277. A portion of the seed layer 278 is disposed below the first layer 280, the second layer 283, and the third layer 284. After the etch back, the total thickness of the first layer 280, the second layer 283 and the third layer 284 (as measured from sidewalls of the upper contact features 275, 276, and 277) may be between about 500 Å and about 3000 Å.

The etch back at block 120 is targeted at the seed layer 278 and it is difficult to selectively etch the seed layer 278 without etching or damaging the upper contact features 275, 276, and 277. In some existing technologies where the protecting layer is not formed, the etch back may damage the upper contact features 275, 276, and 277 and reduce their volumes and contact areas. Such reduction of volumes and contact areas may increase contact resistance between the upper contact features 275, 276, and 277 and overlying contact structures. As shown in FIGS. 19, 20 and 21, the protecting layer of the present disclosure at least protects sidewalls of the upper contact features 275, 276, and 277 during the etch back at block 120 and prevents damages to the upper contact features 275, 276, and 277 and unsatisfactory increase of contact resistance.

Figure 22:
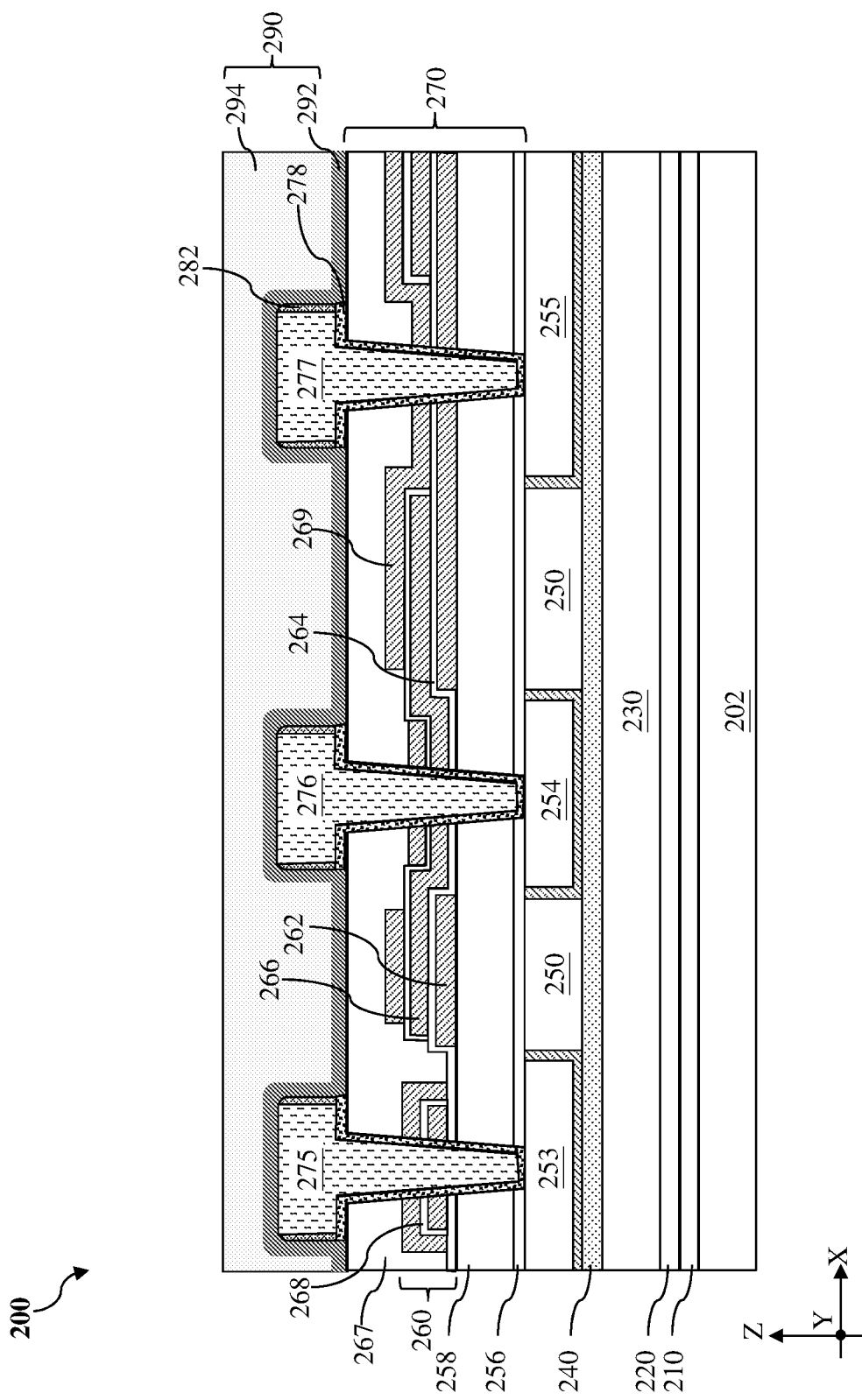
Figure 23:
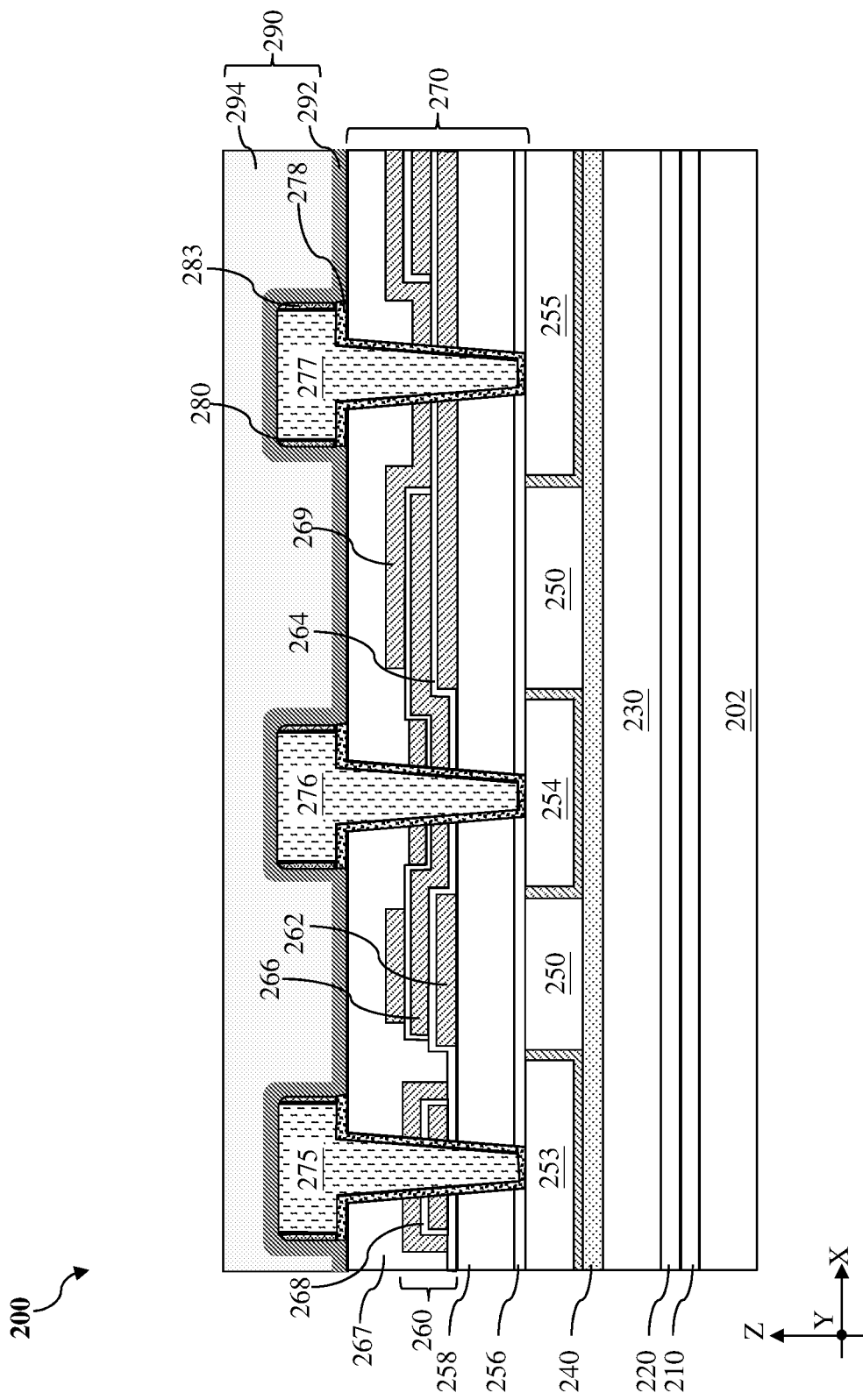
Figure 24:
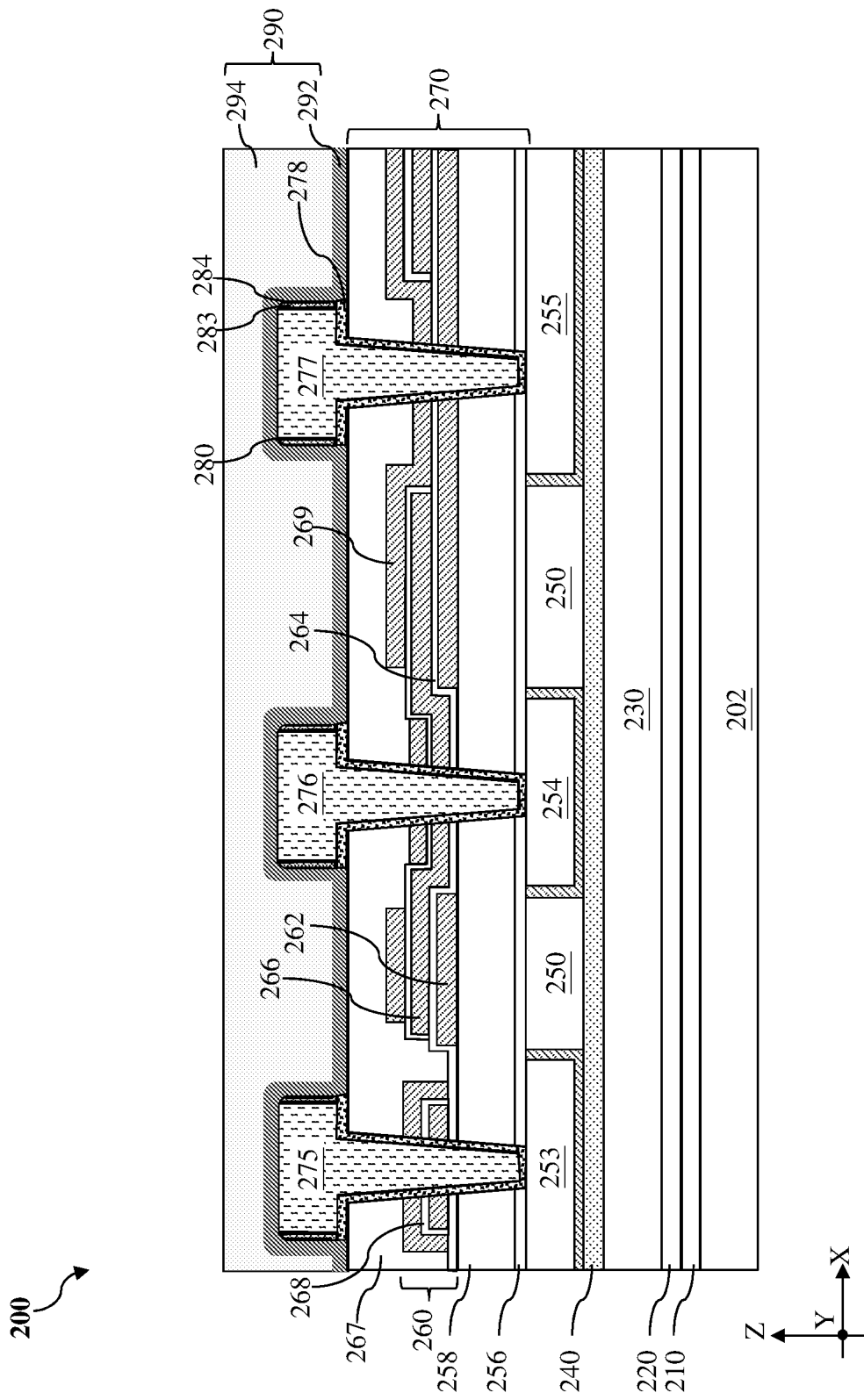

Referring to FIGS. 1, 22, 23, and 24, method 100 includes a block 122 where a second passivation structure 290 is formed over the workpiece 200. In some embodiments, the second passivation structure 290 includes a first passivation layer 292 and a second passivation layer 294. In some embodiments, the first passivation layer 292 include silicon nitride (SiN) and may be formed by CVD, PVD or a suitable method. In some implementations, the first passivation layer 292 may be formed to a thickness between about 25 nm and about 200 nm. The second passivation layer 294 is then formed over the first passivation layer 292. In some embodiments, the second passivation layer 294 may include one or more plasma-enhanced CVD (PECVD) silicon oxide layers, one or more undoped silica glass (USG) layers, or a combination thereof. The second passivation layer 294 may be formed using PECVD, spin-on coating, or other suitable technique to a thickness between about 300 nm and about 2000 nm. As shown in FIG. 22, 23 or 24, the first passivation layer 292 is formed over the workpiece 200, including over the protecting layer, the upper contact features 275, 276, and 277 and the fourth dielectric layer 267. In embodiments represented in FIGS. 22, 23 and 24, the first passivation layer 292 comes in contact with the fourth dielectric layer 267, sidewalls of the seed layer 278, the protecting layer disposed along sidewalls of the upper contact features 275, 276, and 277, and top surfaces of the upper contact features 275, 276, and 277. Because the first passivation layer 292 is formed of silicon nitride, the upper contact features 275, 276 and 277 is spaced apart from the second passivation layer 294, which may include silicon oxide.

Referring to FIG. 1, method 100 includes a block 124 where further processes are performed. Such further processes may include formation of the openings through the second passivation structure 290, deposition of one or more polymeric material layers, patterning of the one or more polymeric material layers, deposition of an under-bump-metallurgy (or under-bump-metallization, UBM) layer, deposition of a copper-containing bump layer, deposition of a cap layer, deposition of a solder layer, and reflowing of the solder layer. These further processes form contact structures for connection to external circuitry.

Methods and semiconductor structures according to the present disclosure provide advantages. For example, processes of the present disclosure form a protecting layer over sidewalls of the upper contact features that extend through a passivation structure to couple to lower contact features. According to the present disclosure, the protecting layer may be a single layer, a dual-layer, or a tri-layer. When the protecting layer is a single layer, it may be formed of silicon nitride. When the protecting layer is a dual-layer, it may include a nitride-containing first layer and an oxide containing second layer spaced apart from the upper contact features. When the protecting layer is a tri-layer, it may include a nitride-containing first layer, an oxide containing second layer, and a nitride containing third layer. The protecting layer protects the upper contact features during an etch back process and prevents excessive volume loss of the upper contact features. It is observed that the protecting layer of the present disclosure may reduce contact resistance.

One aspect of the present disclosure involves semiconductor structure. The semiconductor structure includes a contact feature in a dielectric layer, a passivation structure over the dielectric layer, a conductive feature over the passivation structure, a seed layer disposed between the conductive feature and the passivation structure, a protecting layer disposed along sidewalls of the conductive feature, and a passivation layer over the conductive feature and the protecting layer.

In some embodiments, the contact feature and the conductive feature include copper (Cu). In some implementations, the seed layer includes tantalum nitride (TaN), tantalum (Ta), or copper (Cu). In some instances, the semiconductor structure further includes a metal-insulator-metal (MIM) capacitor embedded in the passivation structure. In some embodiments, the passivation layer includes silicon oxide or undoped silica glass (USG). In some instances, the protecting layer is a single layer and includes silicon nitride. In some embodiments, the protecting layer includes a first layer in contact with the conductive feature and a second layer spaced apart from the conductive feature by the first layer. The first layer includes silicon nitride and the second layer includes silicon oxide. In some embodiments, the protecting layer includes a first layer in contact with the conductive feature, a second layer spaced apart from the conductive feature by the first layer, and a third layer spaced apart from the conductive feature by the first layer and the second layer. The first layer includes silicon nitride, the second layer includes silicon oxide, and the third layer includes silicon nitride.

Another aspect of the present disclosure involves a semiconductor device. The semiconductor device includes a contact feature, a passivation structure over the contact feature, a metal-insulator-metal (MIM) structure embedded in the passivation structure, a conductive feature over the passivation structure and extending through the passivation structure to electrically couple to the contact feature, a seed layer extending along an interface between the conductive feature and the passivation structure, a protecting layer disposed along sidewalls of the conductive feature over the passivation structure, and a passivation layer over the conductive feature and the protecting layer.

In some embodiments, a portion of the seed layer is disposed below the protecting layer. In some implementations, the contact feature and the conductive feature include copper (Cu). In some embodiments, the seed layer includes tantalum nitride (TaN), tantalum (Ta), or copper (Cu). In some instances, the protecting layer is a single layer and includes silicon nitride. In some embodiments, the protecting layer includes a first layer in contact with the conductive feature and a second layer spaced apart from the conductive feature by the first layer. The first layer includes silicon nitride and the second layer includes silicon oxide.

Still another aspect of the present disclosure involves a method. The method includes providing a workpiece that includes a contact feature, a dielectric structure over the contact feature, and a via opening through the dielectric structure to expose the contact feature. The method further includes depositing a seed layer over the workpiece, after the depositing of the seed layer, forming a conductive feature in the via opening, depositing a protecting layer over the conductive feature, etching back the seed layer not covered by the protecting layer or the conductive feature, and depositing a passivation layer over the protecting layer, the conductive feature, and the seed layer.

In some embodiments, the workpiece further includes a metal-insulator-metal (MIM) capacitor embedded in the dielectric structure. In some implementations, the contact feature and the conductive feature include copper (Cu). In some instances, the depositing of the protecting layer includes depositing a single layer that is formed of silicon nitride. In some embodiments, the depositing of the protecting layer includes depositing a first layer on the conductive feature and depositing a second layer over the first layer. The first layer includes silicon nitride and the second layer includes silicon oxide. In some embodiments, the depositing of the protecting layer includes depositing a first layer in contact with the conductive feature, depositing a second layer over the first layer, and depositing a third layer on the second layer. The first layer includes silicon nitride, the second layer includes silicon oxide, and the third layer includes silicon nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising
   providing a workpiece that comprises:
      a contact feature,
      a dielectric structure over the contact feature, and
      a via opening through the dielectric structure to expose the contact feature;
   depositing a seed layer over the workpiece;
   after the depositing of the seed layer, forming a conductive feature in the via opening,
   depositing a protecting layer over the conductive feature;
   etching back the seed layer not covered by the protecting layer or the conductive feature; and
   depositing a passivation layer over the protecting layer, the conductive feature, and the seed layer.

2. The method of claim 1, wherein the workpiece further comprises a metal-insulator-metal (MIM) capacitor embedded in the dielectric structure.

3. The method of claim 1, wherein the contact feature and the conductive feature comprise copper (Cu).

4. The method of claim 1, wherein the depositing of the protecting layer comprises:
   depositing a single layer that is formed of silicon nitride.

5. The method of claim 1, wherein the depositing of the protecting layer comprises:
   depositing a first layer on the conductive feature; and
   depositing a second layer over the first layer,
   wherein the first layer comprises silicon nitride and the second layer comprises silicon oxide.

6. The method of claim 1, wherein the depositing of the protecting layer comprises:
   depositing a first layer in contact with the conductive feature;
   depositing a second layer over the first layer; and
   depositing a third layer on the second layer,
   wherein the first layer comprises silicon nitride,
   wherein the second layer comprises silicon oxide,
   wherein the third layer comprises silicon nitride.

7. A method, comprising:
   providing a workpiece that comprises:
      a contact feature, and
      a passivation structure over the contact feature;
   forming a via opening through the passivation structure to expose a portion of the contact feature;
   after the forming of the via opening, conformally depositing a seed layer over the workpiece, the exposed portion of the contact feature, and the via opening;
   depositing a metal layer over the seed layer;
   patterning the metal layer to form a conductive feature disposed in the via opening and rising above the seed layer;
   depositing a protecting layer over the conductive feature and a portion of the seed layer disposed on a top surface of the passivation structure;
   patterning the protecting layer to expose the portion of the seed layer disposed on the top surface of the passivation structure;
   anisotropically etching the workpiece to remove the protecting layer from a top surface of the conductive feature; and
   after the anisotropically etching, depositing a passivation layer over the workpiece.

8. The method of claim 7, wherein the seed layer comprises titanium (Ti), titanium nitride (TiN), tantalum nitride (TaN), tantalum (Ta), copper (Cu), or a combination thereof.

9. The method of claim 8, wherein the conformally depositing of the seed layer comprises use of atomic layer deposition (ALD), physical vapor deposition (PVD), or chemical vapor deposition (CVD).

10. The method of claim 7, wherein the metal layer comprises copper (Cu).

11. The method of claim 7, wherein the patterning of the protecting layer comprises use of a photolithography process.

12. The method of claim 7, wherein the protecting layer comprises silicon nitride.

13. The method of claim 7, wherein the protecting layer comprises:
   a first dielectric layer;
   a second dielectric layer over the first dielectric layer; and
   a third dielectric layer over the second dielectric layer.

14. The method of claim 13,
   wherein the first dielectric layer and the third dielectric layer comprise silicon nitride,
   wherein the second dielectric layer comprises silicon oxide.

15. A method, comprising:
   providing a workpiece that comprises:
      a contact feature, and
      a first passivation structure over the contact feature and embedding a metal-insulator-metal (MIM) capacitor;
   forming a via opening through the first passivation structure and the MIM capacitor to expose a portion of the contact feature;
   after the forming of the via opening, conformally depositing a seed layer over the workpiece, the exposed portion of the contact feature, and the via opening;
   depositing a metal layer over the seed layer;
   patterning the metal layer to form a conductive feature disposed in the via opening and rising above the seed layer by using the seed layer as an etch stop layer;
   depositing a protecting layer over the conductive feature and a portion of the seed layer disposed on a top surface of the first passivation structure;
   patterning the protecting layer, using a photolithography process, to expose the portion of the seed layer disposed on the top surface of the first passivation structure;
   anisotropically etching the workpiece to remove the protecting layer from a top surface of the conductive feature; and
   after the anisotropically etching, forming a second passivation structure over the workpiece.

16. The method of claim 15, wherein, after the anisotropically etching, a portion of the protecting layer remains disposed along sidewalls of the conductive feature.

17. The method of claim 15, wherein the forming of the second passivation structure comprises:
   depositing a first passivation layer over the workpiece using chemical vapor deposition (CVD) or physical vapor deposition (PVD); and
   depositing a second passivation layer over the first passivation layer using plasma enhanced CVD (PECVD) or spin-on coating.

18. The method of claim 17,
   wherein the first passivation layer comprises silicon nitride,
   wherein the second passivation layer comprises silicon oxide or undoped silica glass (USG).

19. The method of claim 15, wherein the protecting layer comprises a thickness between about 2000 Å and about 3000 Å.

20. The method of claim 15,
   wherein the MIM capacitor comprises a plurality of conductor plate layers insulated from one another by a plurality of insulator layers,
   wherein the seed layer is in contact with each of the plurality of conductor plate layers and each of the plurality of insulator layers.

* * * * *